United States Patent
Lee et al.

(10) Patent No.: US 11,216,139 B2
(45) Date of Patent: Jan. 4, 2022

(54) TOUCH DISPLAY DEVICE

(71) Applicant: LG DISPLAY CO., LTD., Seoul (KR)

(72) Inventors: Yangsik Lee, Paju-si (KR); HwiDeuk Lee, Paju-si (KR); TaeWoo Kim, Paju-si (KR); YongChan Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/939,832

(22) Filed: Jul. 27, 2020

(65) Prior Publication Data

US 2021/0064188 A1 Mar. 4, 2021

(30) Foreign Application Priority Data

Aug. 30, 2019 (KR) .................. 10-2019-0107239

(51) Int. Cl.
*G06F 3/044* (2006.01)
*G06F 3/041* (2006.01)
*H01L 27/32* (2006.01)

(52) U.S. Cl.
CPC .......... *G06F 3/0446* (2019.05); *G06F 3/0412* (2013.01); *G06F 3/0443* (2019.05); *H01L 27/323* (2013.01); *G06F 2203/04102* (2013.01)

(58) Field of Classification Search
CPC .... G06F 3/0446; G06F 3/0412; G06F 3/0443; G06F 2203/04102; G06F 3/0448; G06F 2203/04112; G06F 2203/04111; H01L 27/323; H01L 27/32; H01L 51/5253
See application file for complete search history.

(56) References Cited

U.S. PATENT DOCUMENTS

| | | | | |
|---|---|---|---|---|
| 9,239,656 B2* | 1/2016 | Kim | .................... | G06F 3/04164 |
| 10,219,395 B2* | 2/2019 | Tajima | ................. | H05K 5/0086 |
| 10,290,691 B2* | 5/2019 | Jeong | .................. | H01L 27/3262 |
| 10,795,511 B2* | 10/2020 | Kim | ......................... | G06F 3/044 |
| 10,852,863 B2* | 12/2020 | Hong | ..................... | G06F 3/041 |
| 10,852,891 B2* | 12/2020 | Ahn | ....................... | G06F 3/0412 |
| 2005/0082643 A1* | 4/2005 | Kondo | ............... | H01L 25/0657 |
| | | | | 257/620 |
| 2005/0085887 A1* | 4/2005 | Mori | .................... | A61N 1/0424 |
| | | | | 607/142 |
| 2005/0174029 A1* | 8/2005 | Ogawa | ................ | A61N 1/0492 |
| | | | | 313/326 |
| 2008/0236905 A1* | 10/2008 | Endo | .................. | G02F 1/13338 |
| | | | | 178/18.03 |
| 2011/0141042 A1* | 6/2011 | Kim | ...................... | G06F 3/0412 |
| | | | | 345/173 |

(Continued)

*Primary Examiner* — Amy Onyekaba
(74) *Attorney, Agent, or Firm* — Birch, Stewart, Kolasch & Birch, LLP

(57) ABSTRACT

Provided is a touch display device including a folding area in an active area. The same pattern of touch electrodes can be maintained in both a reference area and a folding area and cracks on touch electrodes in the folding area, by applying a pattern structure of a touch insulation film disposed in the folding area. Therefore, the degradation of touch sensing performance, caused by cracks on the touch electrodes in the folding area, can be prevented and touch sensing sensitivity can be uniform in the reference area and the folding area, thereby improving touch sensing performance of the touch display device including the folding area.

20 Claims, 22 Drawing Sheets

(56) References Cited

U.S. PATENT DOCUMENTS

| | | | |
|---|---|---|---|
| 2013/0300677 A1* | 11/2013 | Kim | G06F 3/0443 345/173 |
| 2015/0042598 A1* | 2/2015 | Chae | G06F 3/0448 345/174 |
| 2015/0153779 A1* | 6/2015 | Ko | G06F 1/1643 345/173 |
| 2016/0154524 A1* | 6/2016 | Yang | G06F 3/0443 345/173 |
| 2016/0170540 A1* | 6/2016 | Yang | G02B 1/14 345/173 |
| 2016/0202831 A1* | 7/2016 | Kim | G06F 3/0446 345/173 |
| 2016/0209954 A1* | 7/2016 | Cho | G06F 3/0446 |
| 2016/0266691 A1* | 9/2016 | Jang | H01L 27/323 |
| 2016/0283025 A1* | 9/2016 | Yang | G02B 1/14 |
| 2017/0031389 A1* | 2/2017 | Yoo | G06F 1/1652 |
| 2017/0194409 A1* | 7/2017 | Jeong | H01L 27/3248 |
| 2017/0315645 A1* | 11/2017 | Park | G06F 3/04146 |
| 2018/0032189 A1* | 2/2018 | Lee | G06F 3/0443 |
| 2018/0120998 A1* | 5/2018 | Jeong | H01L 27/323 |
| 2018/0309079 A1* | 10/2018 | Matsumoto | H01L 51/5203 |
| 2018/0358413 A1* | 12/2018 | Lee | G06F 3/0443 |
| 2019/0004624 A1* | 1/2019 | Zhu | G06F 3/0446 |
| 2019/0064958 A1* | 2/2019 | Liu | G06F 3/0446 |
| 2019/0064991 A1* | 2/2019 | Noh | H04R 7/06 |
| 2019/0198534 A1* | 6/2019 | Je | H01L 29/78696 |
| 2019/0204963 A1* | 7/2019 | Liu | G06F 3/0446 |
| 2019/0324567 A1* | 10/2019 | Hong | G06F 3/0446 |
| 2019/0346711 A1* | 11/2019 | Yeh | G06F 3/0446 |
| 2020/0026382 A1* | 1/2020 | Zhang | G06F 3/0412 |
| 2020/0089355 A1* | 3/2020 | Moon | G06F 3/044 |
| 2020/0333918 A1* | 10/2020 | Lin | G06F 3/0446 |
| 2020/0401246 A1* | 12/2020 | Lee | G06F 3/041 |
| 2020/0401274 A1* | 12/2020 | Moon | G06F 3/045 |
| 2021/0011602 A1* | 1/2021 | Song | G06F 3/0412 |
| 2021/0223913 A1* | 7/2021 | Zhang | G06F 3/0446 |
| 2021/0240326 A1* | 8/2021 | Chou | G06F 3/041 |

* cited by examiner

TOUCH DISPLAY DEVICE

CROSS REFERENCE TO RELATED APPLICATION

This application claims priority to Korean Patent Application No. 10-2019-0107239, filed in the Republic of Korea on Aug. 30, 2019, the entire contents of which are hereby incorporated by reference for all purposes as if fully set forth herein into the present application.

BACKGROUND

Field

Embodiments of the present disclosure relate to a touch display device.

Discussion of the Related Art

Along with the development of the information society, demands for display devices that display images are growing. In this regard, various types of display devices, such as liquid crystal display (LCD) devices and organic light emitting diode (OLED) display devices, have been widely used.

To provide more diverse functions to users, these display devices provide a function of recognizing a user's touch on a display panel and processing an input based on the recognized touch.

For example, a display device capable of touch recognition includes a plurality of touch electrodes disposed or built in a display panel, and can detect the presence or absence of a user's touch and, if any, touched coordinates on the display panel by driving the touch electrodes.

The display device can include a bending area or a folding area according to its type, and further touch electrodes, touch wirings, or the like can be disposed in the bending area or the folding area. In this case, repeated folding of the display device can cause cracks on the touch electrodes and thus can degrade touch sensing performance of the display device.

BRIEF SUMMARY OF THE INVENTION

Embodiments of the present disclosure provide a method of preventing cracks on touch electrodes disposed in a folding area of a touch display device and improving touch sensing performance in the folding area of the touch display device.

Embodiments of the present disclosure provide a method of maintaining the pattern of touch electrodes or touch wirings disposed in a folding area of a touch display device to be identical to the pattern of touch electrodes disposed in an area other than the folding area and preventing or minimizing cracks on the touch electrodes in the folding area of the touch display device.

Embodiments of the present disclosure provide an improved touch display device and method which address the limitations and disadvantages associated with the related art.

According to an aspect, embodiments of the present disclosure provide a touch display device including an active area in which a plurality of subpixels each including a light emitting element are disposed, the active area including a plurality of first areas and at least one second area defined between the first areas, an encapsulation portion disposed on the light emitting elements, a plurality of touch electrodes located on the encapsulation portion and disposed in the active area, a plurality of first touch electrode connection lines disposed in a layer in which the touch electrodes are disposed on the encapsulation portion, each first touch electrode connection line coupling two touch electrodes adjacent in a first direction to each other, a plurality of second touch electrode connection lines disposed in a layer different from the layer in which the touch electrodes are disposed on the encapsulation portion, each second touch electrode connection line coupling two touch electrodes adjacent in a second direction to each other, and a touch insulation film disposed in the first areas and at least a part of the second area, in a layer between the layer in which the touch electrodes are disposed and the layer in which the second touch electrode connection lines are disposed.

The touch insulation film can be disposed in an area except for at least a part of an area other than an area overlapping with the touch electrodes and an area other than an area overlapping with the second touch electrode connection lines, in the second area.

According to an aspect, embodiments of the present disclosure provide a touch display device including an active area including a plurality of first areas and at least one second area defined between the first areas, a plurality of touch electrodes disposed in the active area, a plurality of first touch electrode connection lines disposed in a layer in which the touch electrodes are disposed, each first touch electrode connection line coupling two touch electrodes adjacent in a first direction to each other, a plurality of second touch electrode connection lines disposed in a different layer from the layer in which the touch electrodes are disposed, each second touch electrode connection line coupling two touch electrodes adjacent in a second direction to each other, and a touch insulation film disposed in the first areas and at least a part of the second area, wherein the touch insulation film is disposed in at least a part of an area other than an area overlapping with the touch electrodes and an area overlapping with the second touch electrode connection lines, in the second area.

According to an aspect, embodiments of the present disclosure provide a touch display device including an active area including a plurality of first areas and at least one second area defined between the first areas, a plurality of touch electrodes disposed in the active area, a plurality of touch electrode connection lines disposed in an area except for the second area and located in a different layer from a layer in which the touch electrodes are disposed, each touch electrode connection line coupling two touch electrodes adjacent in a direction to each other, and a touch insulation film disposed in the first areas and at least a part of the second area, wherein the touch insulation film is removed from an area overlapping with the touch electrodes or from at least a part of an area except for the area overlapping with the touch electrodes, in the second area.

According to embodiments of the present disclosure, an insulation film, which is disposed on or under touch electrodes in a folding area of a panel, is patterned based on the shapes of the touch electrodes or touch electrode connection lines. Therefore, force from folding of the folding area can be distributed through the insulation film, thereby preventing (or minimizing) cracks on the touch electrodes.

According to embodiments of the present disclosure, because cracks on the touch electrodes are prevented (or minimized) by patterning the insulation film disposed in the folding area, the pattern of the touch electrodes is maintained identical in both the folding area and an area other than the folding area. Therefore, arrangement of the touch electrodes can be facilitated, and touch sensing performance can be improved.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION OF THE EMBODIMENTS

Figure 1:
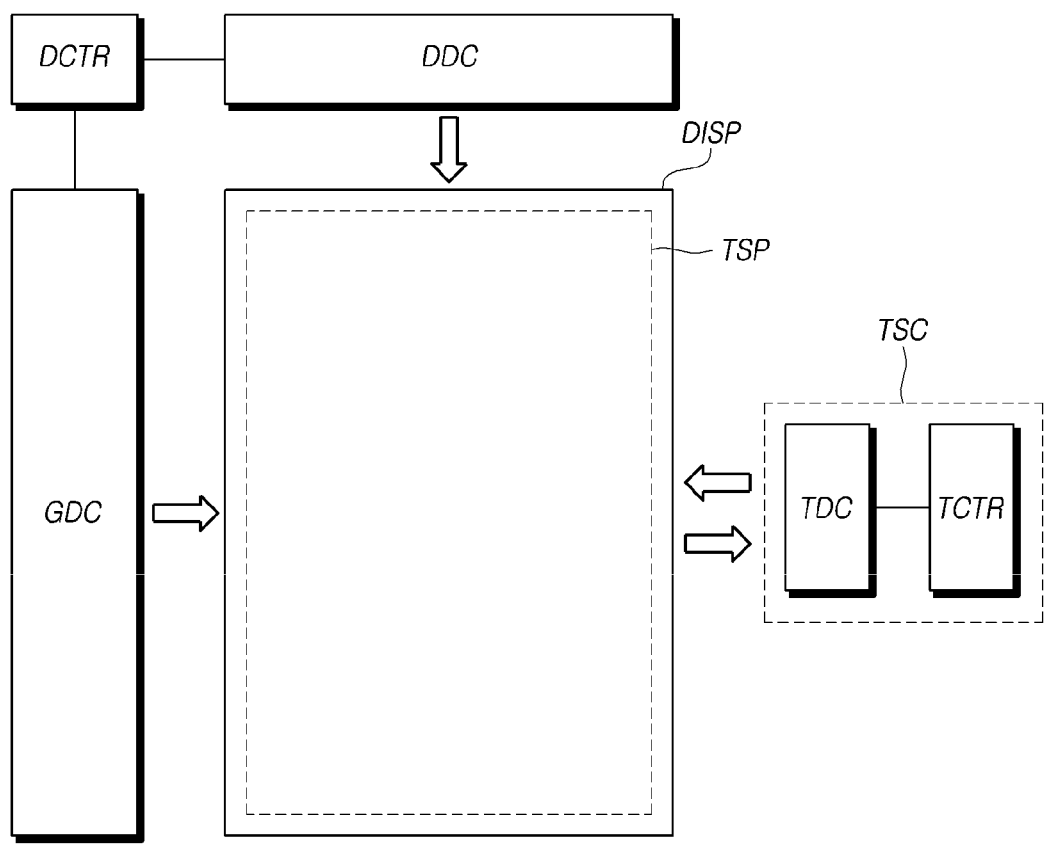
FIG. 1 is a schematic diagram illustrating the configuration of a touch display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description can make the subject matter in some embodiments of the present invention rather unclear. The terms such as "including", "having", "containing", "constituting", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

FIG. 1 is a diagram illustrating the system configuration of a touch display device according to embodiments of the present disclosure. All the components of the touch display device according to all embodiments of the present disclosure are operatively coupled and configured.

A Referring to FIG. 1, the touch display device according to the embodiments of the present disclosure can provide both an image display function and a touch sensing function.

To provide the image display function, the touch display device according to the embodiments of the present disclosure can include a display panel DISP in which a plurality of data lines and a plurality of gate lines are disposed, and a plurality of subpixels defined by the plurality of data lines and the plurality of gate lines are arranged, a data driving circuit DDC driving the plurality of data lines, a gate driving circuit GDC driving the plurality of gate lines, and a display controller DCTR controlling operations of the data driving circuit DDC and the gate driving circuit GDC.

Each of the data driving circuit DDC, the gate driving circuit GDC, and the display controller DCTR can be implemented in one or more individual parts. In some cases, two or more of the data driving circuit DDC, the gate driving circuit GDC, and the display controller DCTR can be integrated into one part. For example, the data driving circuit DDC and the display controller DCTR can be implemented into one integrated circuit (IC) chip.

To provide the touch sensing function, the touch display device according to the embodiments of the present disclosure can include a touch panel TSP including a plurality of touch electrodes, and a touch sensing circuit TSC supplying a touch driving signal to the touch panel TSP, detecting a touch sensing signal from the touch panel TSP, and sensing the presence or absence of a user's touch on the touch panel TSP or a touched position (touched coordinates) based on the detected touch sensing signal.

The touch sensing circuit TSC can include, for example, a touch driving circuit TDC supplying the touch driving signal to the touch panel TSP and detecting the touch sensing signal from the touch panel TSP, and a touch controller TCTR sensing the presence or absence of a user's touch on the touch panel TSP or a touched position (touched coordinates) based on the touch sensing signal detected by the touch driving circuit TDC.

The touch driving circuit TDC can include a first circuit part supplying the touch driving signal to the touch panel TSP and a second circuit part detecting the touch sensing signal from the touch panel TSP.

The touch driving circuit TDC and the touch controller TCTR can be implemented as separate parts, or integrated into one part, when needed.

Each of the data driving circuit DDC, the gate driving circuit GDC, and the touch driving circuit TDC can be implemented as one or more ICs, and configured as a chip on glass (COG) type, a chip on film (COF) type, or a tape carrier package (TCP) type from the perspective of electrical connection to the display panel DISP. The gate driving circuit GDC can also be configured as a gate in panel (GIP) type.

Each of the circuit components DDC, GDC, and DCTR for display driving and the circuit components TDC and TCTR for touch sensing can be implemented as one or more individual parts. In some cases, one or more of the circuit components DDC, GDC, and DCTR for display driving and one or more of the circuit components TDC and TCTR for touch sensing can functionally be integrated and thus implemented as one or more parts.

For example, the data driving circuit DDC and the touch driving circuit TDC can be integrated into one or more IC chips. When the data driving circuit DDC and the touch driving circuit TDC are integrated into two or more IC chips, the IC chips can have a data driving function and a touch driving function, respectively.

The touch display device according to embodiments of the present disclosure can be any of various types such as an OLED device and an LCD device. For the convenience of description, the following description is given in the context of the touch display device being an OLED device, by way of example. That is although the display panel DISP can be any of various types such as an OLED panel and an LCD panel, an OLED panel is taken below as an example of the display panel DISP, for the convenience of description.

Further, the touch panel TSP can include a plurality of touch electrodes to which the touch driving signal can be applied or from which the touch sensing signal can be detected, and a plurality of touch routing lines that couple the touch electrodes to the touch driving circuit TDC.

In one example, the touch panel TSP can be located outside the display panel DISP. For example, the touch panel TSP and the display panel DISP can be separately fabricated and then combined. This touch panel TSP is referred to as an external type or an add-on type.

In contrast, in another example the touch panel TSP can be built in the display panel DISP. For instance, when the display panel DISP is fabricated, a touch sensor structure including the plurality of touch electrodes and the plurality of touch routing lines of the touch panel TSP can be formed together with electrodes and signal lines for display driving. This touch panel TSP is referred to as an internal type. For the convenience of description, the touch panel TSP will be described as an internal type, by way of example, but can be of other types.

Figure 2:
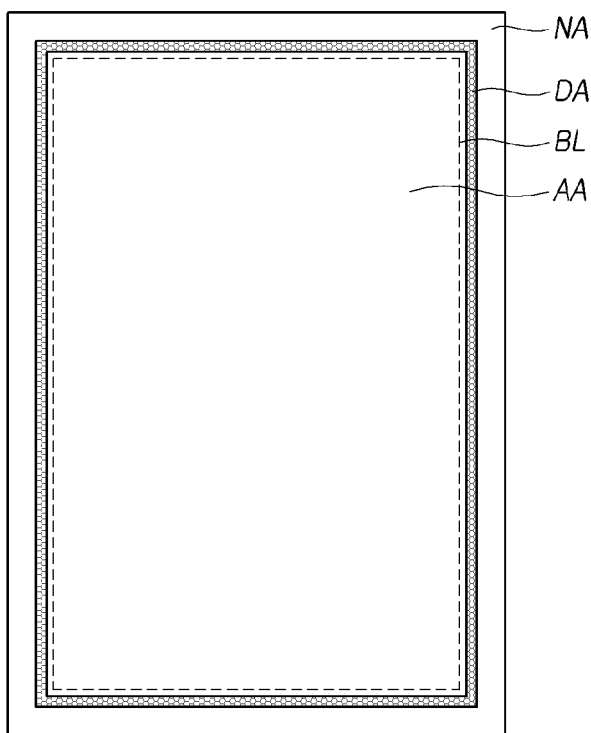
FIG. 2 is a schematic diagram illustrating a display panel in the touch display device according to embodiments of the present disclosure.

FIG. 2 is a diagram schematically illustrating the display panel DISP in the touch display device according to embodiments of the present disclosure.

Referring to FIG. 2, the display panel DISP can include an active area AA in which an image is displayed and a non-active area NA defined outside an outer boundary line BL of the active area AA.

A plurality of subpixels can be arranged and electrodes and signal lines for display driving can be disposed in the active area AA of the display panel DISP.

Further, a plurality of touch electrodes for touch sensing and a plurality of touch routing lines electrically coupled to the touch electrodes can be disposed in the active area AA of the display panel DISP. Accordingly, the active area AA can also be referred to as a touch sensing area in which touch sensing is possible.

Link lines extended from or electrically coupled to the signal lines disposed in the active area AA and pads electrically coupled to the link lines can be disposed in the non-active area NA of the display panel DISP. The pads disposed in the non-active area NA can be bonded or electrically coupled to the display driving circuits DDC, GDC, and so on.

Link lines extended from or electrically coupled to the touch routing lines disposed in the active area AA and pads electrically coupled to the touch routing lines can be disposed in the non-active area NA of the display panel DISP. The pads disposed in the non-active area NA can be bonded or electrically coupled to the touch driving circuit TDC.

In the non-active area NA, extensions of parts of outermost touch electrodes among the plurality of touch electrodes disposed in the active area AA can exist, or one or more electrodes (touch electrodes) formed of the same material as the plurality of touch electrodes disposed in the active area AA can further be disposed.

For example, all of the plurality of touch electrodes disposed in the display panel DISP can exist within the active area AA, a part (e.g., the outermost touch electrodes) of the plurality of touch electrodes disposed in the display panel DISP can exist in the non-active area NA, or a part (e.g., the outermost touch electrode) of the plurality of touch electrodes disposed in the display panel DISP can exist across the active area AA and the non-active area NA.

Referring to FIG. 2, the display panel DISP of the touch display device according to embodiments of the present disclosure can include a dam area DA in which a dam DAM is disposed to prevent collapse of any layer (e.g., an encapsulation portion in the OLED panel) in the active area AA.

The dam area DA can be located at a boundary point between the active area AA and the non-active area NA or at a point in the non-active area NA outside the active area AA.

The dam DAM disposed in the dam area DA can surround the active area AA in all directions or can be disposed outside only one or more portions (e.g., one or more portions having a fragile layer) of the active area AA.

The dam DAM disposed in the dam area DA can be a single interconnected pattern or two or more disconnected patterns. Further, only a primary dam, two dams (the primary dam and a secondary dam), or three or more dams can be disposed in the dam area DA.

In the dam area DA, there can be only the primary dam in one direction, and both the primary dam and the secondary dam in another direction.

Figure 3:
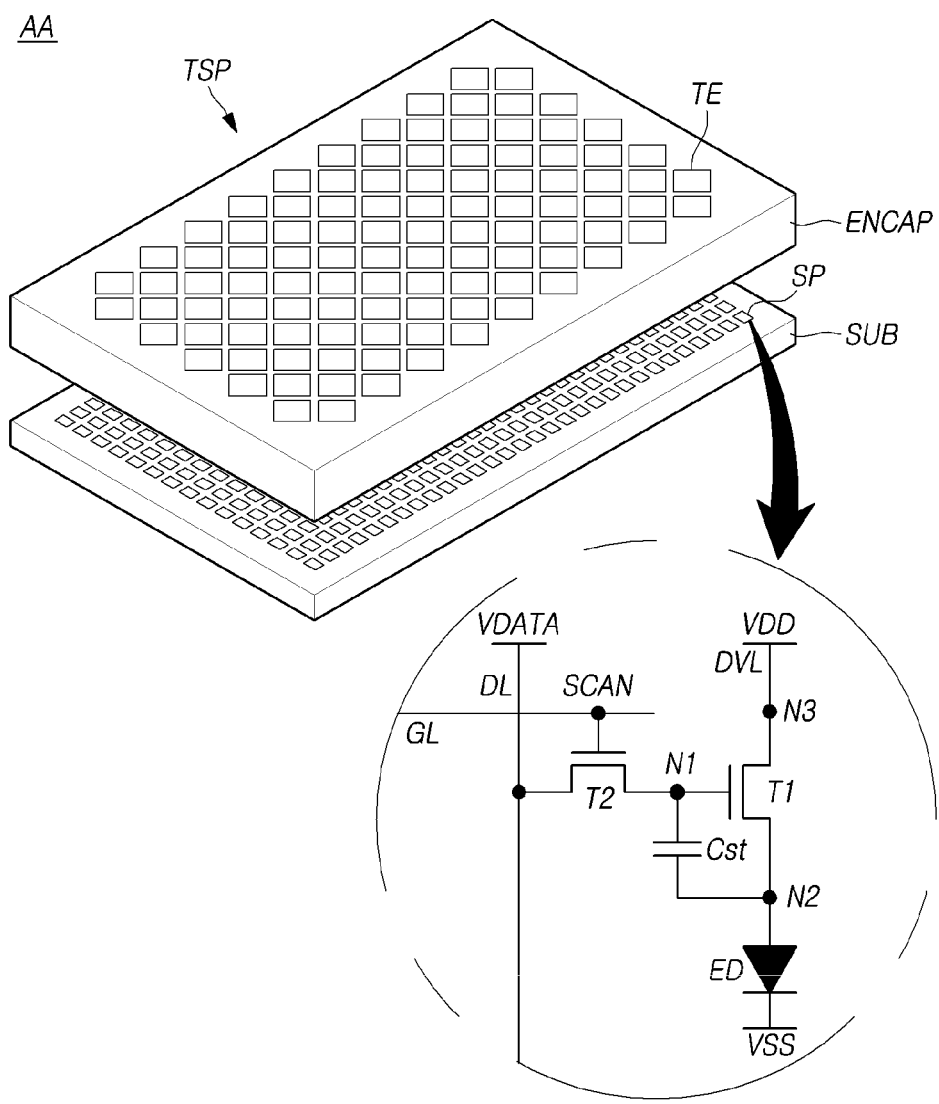
FIG. 3 is a diagram illustrating an exemplary built-in structure of a touch panel in the display panel according to embodiments of the present disclosure.

FIG. 3 is a diagram illustrating an exemplary built-in structure of touch panel TSP in the display panel DISP according to embodiments of the present disclosure.

Referring to FIG. 3, a plurality of subpixels SP can be arranged on a substrate SUB in the active area AA of the display panel DISP.

Each sub-pixel SP can include a light emitting element ED, a first transistor T1 driving the light emitting element ED, a second transistor T2 transmitting a data voltage VDATA to a first node N1 of the first transistor T1, and a storage capacitor Cst maintaining a constant voltage for the duration of one frame.

The first transistor T1 can include the first node N1 to which the data voltage VDATA can be applied, a second node N2 electrically coupled to the light emitting element ED, and a third node N3 to which a driving voltage VDD is applied from a driving voltage line DVL. The first node N1 can be a gate node, the second node N2 can be a source node or a drain node, and the third node N3 can be the drain node or the source node. The first transistor T1 is also referred to as a driving transistor driving the light emitting element ED.

The light emitting element ED can include a first electrode (e.g., an anode electrode), a light emitting layer, and a second electrode (e.g., a cathode electrode). The first electrode can be electrically coupled to the second node N2 of the first transistor T1, and a base voltage VSS can be applied to the second electrode.

In the light emitting element ED, the light emitting layer can be an organic light emitting layer containing an organic material. In this case, the light emitting element ED can be an OLED.

On and off of the second transistor T2 can be controlled by a scan signal SCAN applied through a gate line GL, and coupled between the first node N1 of the first transistor T1 and a data line DL. The second transistor T2 is also referred to as a switching transistor.

When the second transistor T2 is turned on by the scan signal SCAN, the data voltage VDATA supplied from the data line DL is transferred to the first node N1 of the first transistor T1.

The storage capacitor Cst can be electrically coupled between the first node N1 and the second node N2 of the first transistor T1.

Each subpixel SP can have a 2T1C structure including two transistors T1 and T2 and one capacitor Cst, as illustrated in FIG. 3. In some cases, the subpixel SP can further include one or more transistors or one or more capacitors.

The storage capacitor Cst can be not a parasitic capacitor (e.g., Cgs or Cgd) which is an internal capacitor between the first node N1 and the second node N2 of the first transistor T1, but an external capacitor intentionally designed to be outside the first transistor T1.

Each of the first transistor T1 and the second transistor T2 can be an n-type transistor or a p-type transistor.

As described before, circuit elements such as a light emitting element ED, two or more transistors T2 and T2, and one or more capacitors Cst are disposed on the display panel DISP. Since these circuit elements (especially, the light emitting element ED) are vulnerable to external moisture or oxygen, an encapsulation portion ENCAP can be disposed on the display panel DISP to prevent external moisture or oxygen from penetrating into the circuit elements (especially, the light emitting element ED).

The encapsulation portion ENCAP can have a single layer or multiple layers.

In the touch display device according to embodiments of the present disclosure, the touch panel TSP can be formed on the encapsulation portion ENCAP.

For example, the touch sensor structure with the plurality of touch electrodes TE in the touch panel TSP can be disposed on the encapsulation ENCAP in the touch display device.

During touch sensing, the touch driving signal or the touch sensing signal can be applied to the touch electrodes TE. Therefore, an electric potential difference can be generated between the touch electrodes TE and the cathode electrodes disposed with the encapsulation portion ENCAP in between, thereby generating unnecessary parasitic capacitance during touch sensing. Since the parasitic capacitance can degrade touch sensitivity, the distance between the touch electrodes TE and the cathode electrodes can be set to a predetermined value (e.g., 1 um) or more in consideration of a panel thickness, a panel manufacturing process, and display performance in order to reduce the parasitic capacitance. For this purpose, the thickness of the encapsulation portion ENCAP can be set to at least 1 μm.

Figure 4:
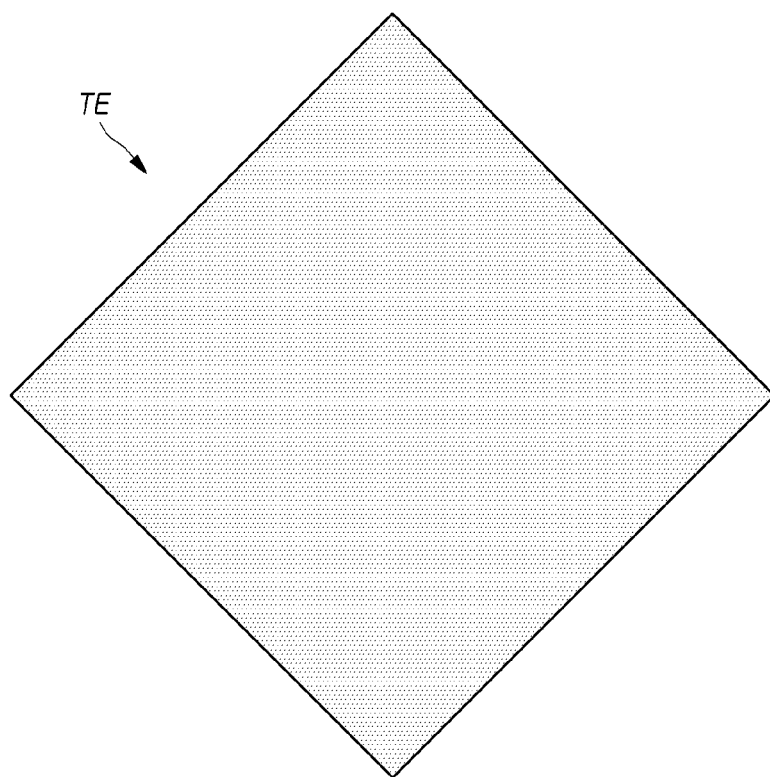
FIGS. 4 and 5 are diagrams illustrating exemplary types of touch electrodes arranged in the display panel according to embodiments of the present disclosure.
Figure 5:
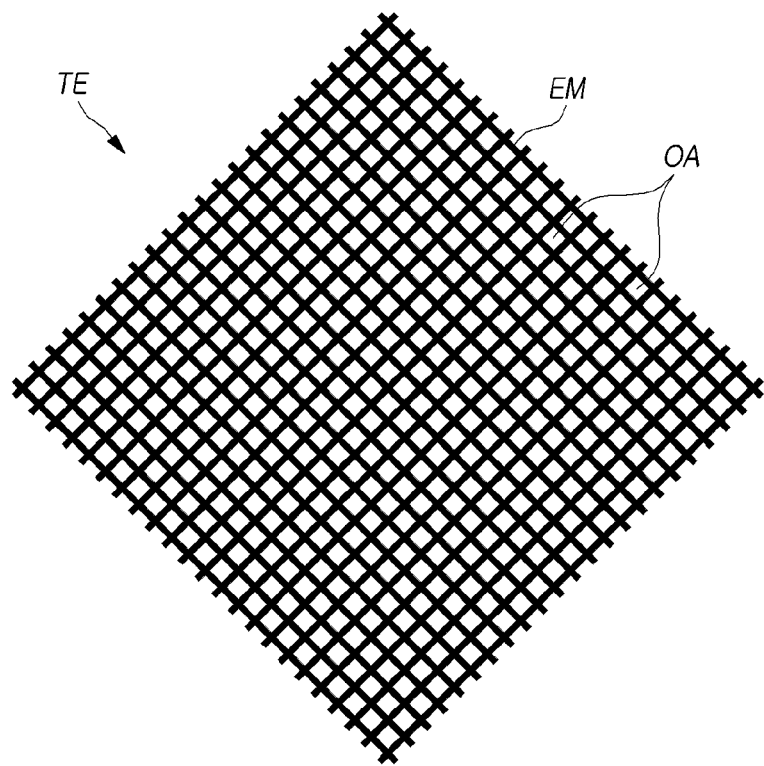

FIGS. 4 and 5 are diagrams illustrating exemplary types of the touch electrodes TE disposed on the display panel DISP according to embodiments of the present disclosure.

As illustrated in FIG. 4, each touch electrode TE disposed on the display panel DISP can be a plate-shaped electrode metal without an opening. In this case, each touch electrode TE can be a transparent electrode. For example, each touch electrode TE can be formed of a transparent electrode material so that light emitted from a plurality of underlying subpixels SP can be transmitted upward.

In contrast, as illustrated in FIG. 5, each touch electrode TE disposed on the display panel DISP can be an electrode metal EM with two or more openings OA through patterning into a mesh type.

The electrode metal EM corresponds to a substantial touch electrode TE, to which the touch driving signal is applied or in which the touch sensing signal is sensed.

As illustrated in FIG. 5, when each touch electrode TE is an electrode metal EM patterned into a mesh type, two or more openings OA can exist in the area of the touch electrode TE.

Each of the two or more openings OA in each touch electrode TE can correspond to light emitting areas of one or more subpixels SP. For example, the plurality of openings OA are paths through which light emitted from a plurality of underlying subpixels SP pass upward. The following description is given with the appreciation that each touch electrode TE is a mesh-type electrode metal EM, by way of example for the convenience of description.

The electrode metal EM corresponding to each touch electrode TE can be located on a bank disposed in an area other than the light emitting areas of two or more subpixels SP.

A plurality of touch electrodes TE can be formed by forming a wide electrode metal EM in a mesh type and then cutting the electrode metal EM into predetermined patterns which are electrically separated from each other.

The outline of the touch electrode TE can be shaped into a square such as a diamond or a rhombus, or any other shape such as a triangle, a pentagon, or a hexagon.

Figure 6:
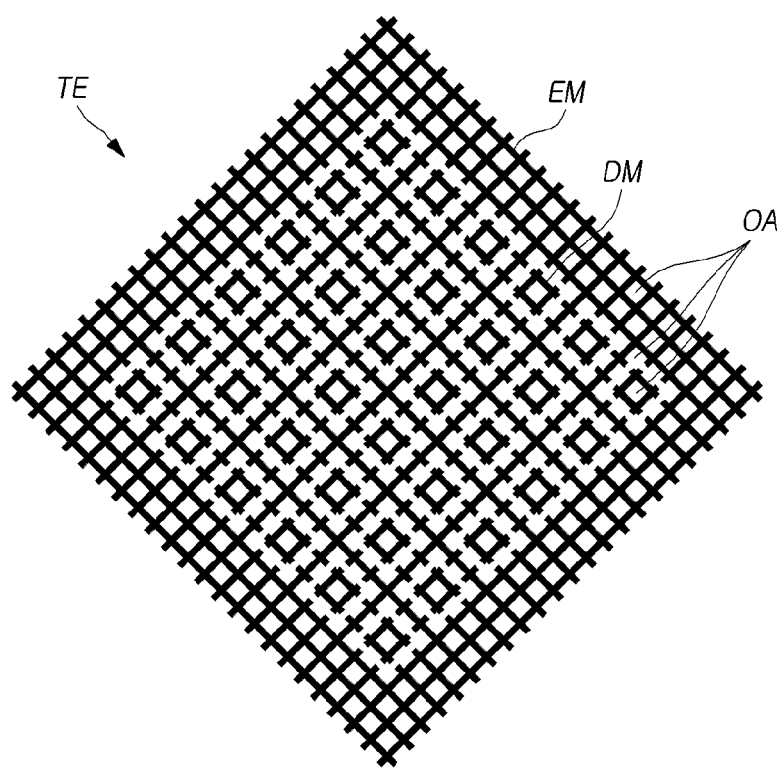
FIG. 6 is a diagram illustrating an exemplary mesh-type touch electrode illustrated in FIG. 5.

FIG. 6 is a diagram illustrating an example of the mesh-type touch electrode TE of FIG. 5.

Referring to FIG. 6, there can be one or more dummy metals DM separated from the mesh-type electrode metal EM in the area of each touch electrode TE.

The electrode metal EM is a part corresponding to a substantial touch electrode TE, to which the touch driving signal is applied or in which the touch sensing signal is sensed, whereas the dummy metals DM are present in the area of the touch electrode TE, to which the touch driving signal is not applied and from which the touch sensing signal is not detected. For example, the dummy metals DM can be electrically floated metals.

Therefore, the electrode metal EM can be electrically coupled to the touch driving circuit TDC, whereas the dummy metals DM may not be electrically coupled to the touch driving circuit TDC.

In the area of each touch electrode TE, one or more dummy metals DM can exist, disconnected from the electrode metal EM.

Alternatively, one or more dummy metals DM can exist, disconnected from the electrode metal EM only in the area of each of some touch electrodes TE. For example, there can be no dummy metal DM in the areas of some touch electrodes TE.

Regarding the role of the dummy metals DM, when only the electrode metal EM exists in a mesh type with no dummy metal DM in the area of a touch electrode TE as illustrated in FIG. 5, the visibility problem that the outline of the electrode metal EM appears on a screen can occur.

In contrast, when one or more dummy metals DM are present in the area of the touch electrode TE as illustrated in FIG. 6, the visibility problem that the outline of the electrode metal EM appears on a screen can be prevented.

Further, the presence or absence of a dummy metal DM or the number of dummy metals DM (a dummy metal ratio) can be adjusted for each touch electrode TE. The resulting adjustment of the magnitude of the capacitance for each touch electrode TE can lead to improved touch sensitivity.

Some points of the electrode metal EM formed in the area of one touch electrode TE can be cut to produce dummy metals DM. For example, the electrode metal EM and the dummy metals DM can be formed of the same material in the same layer.

The touch display device according to embodiments of the present disclosure can sense a touch based on capacitance generated in the touch electrodes TE.

For touch sensing, the touch display device according to embodiments of the present disclosure can adopt a mutual-capacitance-based touch sensing scheme or a self-capacitance-based touch sensing scheme as a capacitance-based sensing scheme.

In the mutual-capacitance-based touch sensing scheme, a plurality of touch electrodes TE can be divided into driving touch electrodes (transmitting touch electrodes) to which the touch driving signal is applied, and sensing touch electrodes (receiving touch electrodes) in which the touch sensing signal is detected and which generate capacitance along with the driving touch electrodes.

In this mutual-capacitance-based touch sensing scheme, the touch sensing circuit TSC can sense the presence or absence of a touch and/or touched coordinates based on a change in capacitance (mutual capacitance) between a driving touch electrode and a sensing touch electrode according to the presence or absence of a pointer such as a finger or a pen.

In the self-capacitance-based touch sensing scheme, each touch electrode TE can function as both a driving touch electrode and a sensing touch electrode. For example, the touch sensing circuit TSC can apply the touch driving signal to at least one touch electrode TE, detect a touch sensing signal through the touch electrode TE to which the touch driving signal is applied, and sense the presence or absence of a touch and/or touched coordinates by determining a change in capacitance between a pointer such as a finger or a pen and the touch electrode TE based on the detected touch sensing signal. In the self-capacitance-based touch sensing scheme, there is no distinction between a driving touch electrode and a sensing touch electrode.

As such, the touch display device according to embodiments of the present disclosure can sense a touch in the mutual-capacitance-based touch sensing scheme or the self-capacitance-based touch sensing scheme. However, for the convenience of description, the following description is given with the appreciation that the touch display device performs mutual-capacitance-based touch sensing and has a touch sensor structure for the mutual-capacitance-based touch sensing, by way of example.

Figure 7:
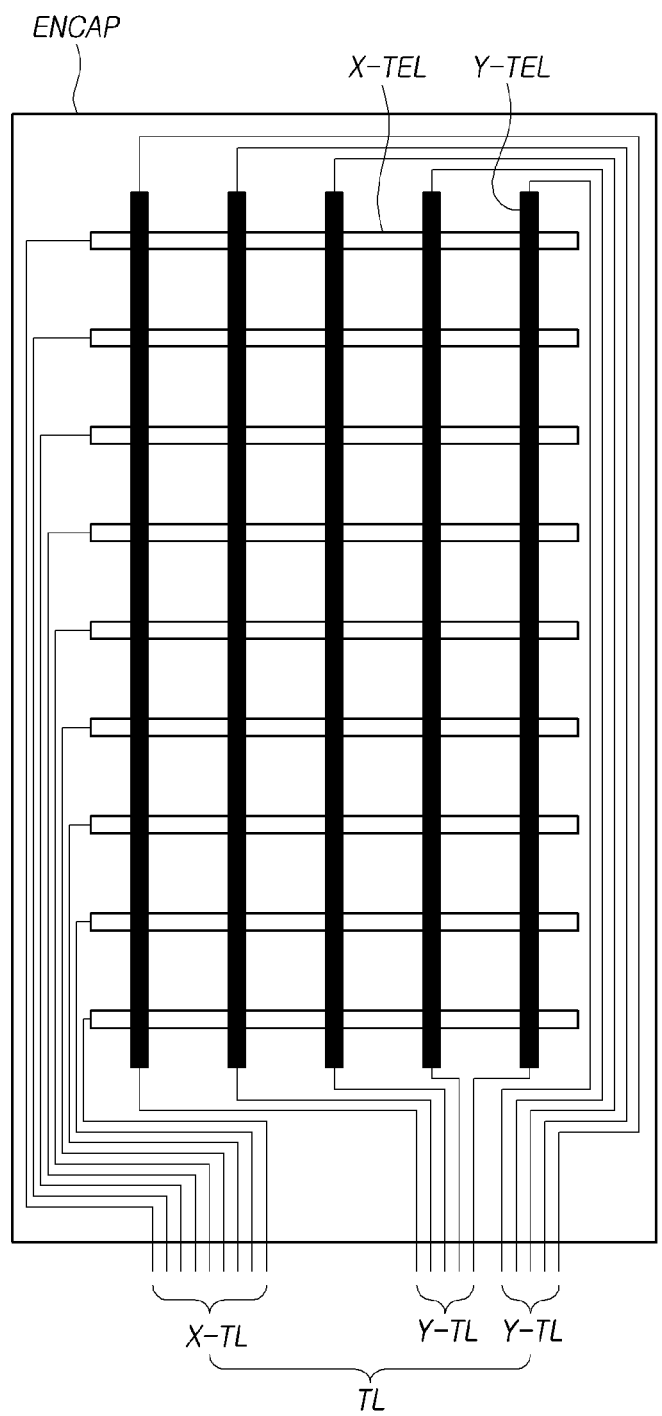
FIG. 7 is a simplified diagram illustrating the structure of a touch sensor in the display panel according to embodiments of the present disclosure.
Figure 8:
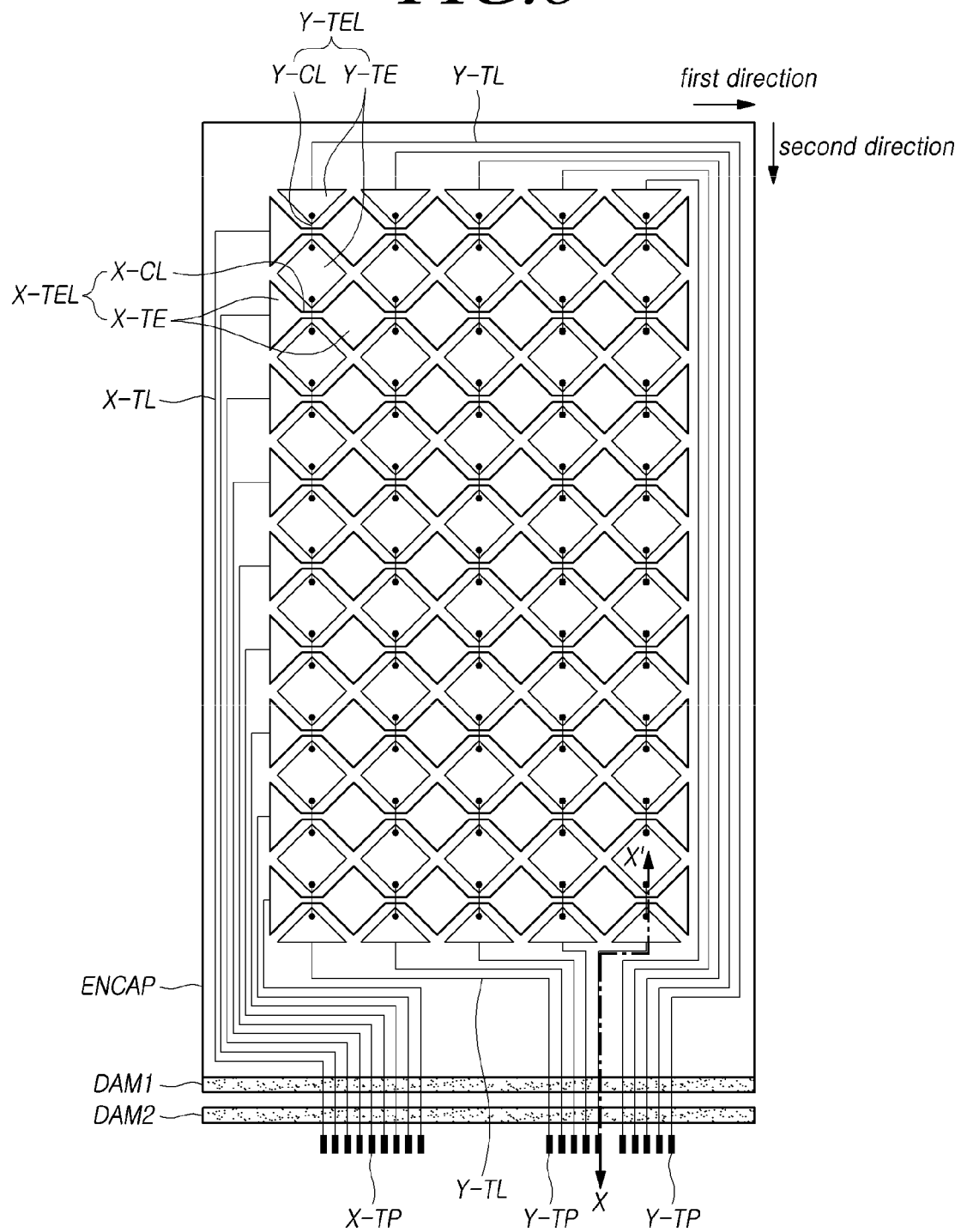
FIG. 8 is a diagram illustrating exemplary implementation of the structure of the touch sensor illustrated in FIG. 7.

FIG. 7 is a simplified diagram illustrating the touch sensor structure of the display panel DISP according to embodiments of the present disclosure, and FIG. 8 is a diagram illustrating an implementation example of the touch sensor structure of FIG. 7.

Referring to FIG. 7, a touch sensor structure for mutual-capacitance-based touch sensing can include a plurality of X-touch electrode lines X-TEL and a plurality of Y-touch electrode lines Y-TEL. The plurality of X-touch electrode lines X-TEL and the plurality of Y-touch electrode lines Y-TEL are positioned on the encapsulation portion ENCAP.

The plurality of X-touch electrode lines X-TEL can be arranged in a first direction, and the plurality of Y-touch electrode lines Y-TEL can be arranged in a second direction different from the first direction.

In the present disclosure, the first direction and the second direction can be different relative to each other. For example, the first direction can be an x-axis direction and the second direction can be a y-axis direction. On the contrary, the first direction can be the y-axis direction and the second direction can be the x-axis direction. Further, the first direction and the second direction can or may not be orthogonal to each other. Further, rows and columns are relative to each other, and thus can be exchanged according to a viewing point.

Each of the plurality of X-touch electrode lines X-TEL can include a plurality of X-touch electrodes X-TE electrically coupled to each other. Each of the plurality of Y-touch electrode lines Y-TEL can include a plurality of Y-touch electrodes Y-TE electrically coupled to each other.

The plurality of X-touch electrodes X-TE and the plurality of Y-touch electrodes Y-TE are included in the plurality of touch electrodes TE and are different in roles (functions).

For example, the plurality of X-touch electrodes X-TE in each of the plurality of X-touch electrode lines X-TEL can be driving touch electrodes, and the plurality of Y-touch electrodes Y-TE in each of the plurality of Y-touch electrode lines Y-TEL can be sensing touch electrodes. In this case, each of the plurality of X-touch electrode lines X-TEL corresponds to a driving touch electrode line, and each of the plurality of Y-touch electrode lines Y-TEL corresponds to a sensing touch electrode line.

On the contrary, the plurality of X-touch electrodes X-TE in each of the plurality of X-touch electrode lines X-TEL can be sensing touch electrodes, and the plurality of Y-touch electrodes Y-TE in each of the plurality of Y-touch electrode lines Y-TEL can be driving touch electrodes. In this case, each of the plurality of X-touch electrode lines X-TEL corresponds to a sensing touch electrode line, and each of the plurality of Y-touch electrode lines Y-TEL corresponds to a driving touch electrode line.

A touch sensor metal for touch sensing can include a plurality of touch routing lines TL in addition to the plurality of X-touch electrode lines X-TEL and the plurality of Y-touch electrode lines Y-TEL.

The plurality of touch routing lines TL can include one or more X-touch routing lines X-TL coupled to each of the plurality of X-touch electrode lines X-TEL, and one or more Y-touch routing lines Y-TL coupled to each of the plurality of Y-touch electrode lines Y-TEL.

Referring to FIG. 8, each of the plurality of X-touch electrode lines X-TEL can include a plurality of X-touch electrodes X-TE disposed in the same row (or column) and one or more X-touch electrode connection lines X-CL electrically coupling the plurality of X-touch electrodes X-TE to each other. An X-touch electrode connection line X-CL coupling two adjacent X-touch electrodes X-TE to each other can be a metal integrated with the two adjacent X-touch electrodes X-TE (see FIG. 8) or a metal coupled to the two adjacent X-touch electrodes X-TE through contact holes.

Each of the plurality of Y-touch electrode lines Y-TEL can include a plurality of Y-touch electrodes Y-TE disposed in the same column (or row) and one or more Y-touch electrode connection lines Y-CL electrically coupling the plurality of Y-touch electrodes Y-TE to each other. A Y-touch electrode connection line Y-CL coupling two adjacent Y-touch electrodes Y-TE to each other can be a metal integrated with the two adjacent Y-touch electrodes Y-TE or a metal coupled to the two adjacent Y-touch electrodes Y-TE through contact holes (see FIG. 8).

The X-touch electrode connection lines X-CL and the Y-touch electrode connection lines Y-CL can intersect in the areas (touch electrode line intersections) where the X-touch electrode lines X-TEL and the Y-touch electrode lines Y-TEL intersect.

In this case, the X-touch electrode connection lines X-CL and the Y-touch electrode connection lines Y-CL can intersect in the areas (touch electrode line intersections) where the X-touch electrode lines X-TEL and the Y-touch electrode lines Y-TEL intersect.

When the X-touch electrode connection lines X-CL and the Y-touch electrode connection lines Y-CL intersect in the touch electrode line intersections in this manner, the X-touch electrode connection lines X-CL and the Y-touch electrode connection lines Y-CL should be located in different layers.

Therefore, the plurality of X-touch electrodes X-TE, the plurality of X-touch electrode connection lines X-CL, the plurality of Y-touch electrodes Y-TE, the plurality of Y-touch electrode lines Y-TEL, and the plurality of Y-touch electrode connection lines Y-CL can be located in two or more layers, so that the plurality of X-touch electrode lines X-TEL can intersect the plurality of Y-touch electrode lines Y-TEL.

Referring to FIG. 8, each of the plurality of X-touch electrode lines X-TEL is electrically coupled to a corresponding X-touch pad X-TP through one or more X-touch routing lines X-TL. For example, the outermost one of the plurality of X-touch electrodes X-TE included in one X-touch electrode line X-TEL is electrically coupled to a corresponding X-touch pad X-TP.

Each of the plurality of Y-touch electrode lines Y-TEL is electrically coupled to a corresponding Y-touch pad Y-TP through one or more Y-touch routing lines Y-TL. For example, the outermost one of the plurality of Y-touch electrodes Y-TE included in one Y-touch electrode line Y-TEL is electrically coupled to a corresponding Y-touch pad Y-TP.

As illustrated in FIG. 8, the plurality of X-touch electrode lines X-TEL and the plurality of Y-touch electrode lines Y-TEL can be disposed on the encapsulation portion ENCAP. For example, the plurality of X-touch electrodes X-TE and the plurality of X-touch electrode connection lines X-CL included in the plurality of X-touch electrode lines X-TEL can be disposed on the encapsulation portion ENCAP. The plurality of Y-touch electrodes Y-TE and the plurality of Y-touch electrode connection lines Y-CL included in the plurality of Y-touch electrode lines Y-TEL can be disposed on the encapsulation portion ENCAP.

As illustrated in FIG. 8, each of the plurality of X-touch routing lines X-TL electrically coupled to the plurality of X-touch electrode lines X-TEL can be disposed on the encapsulation portion ENCAP and extended even to a place free of the encapsulation portion ENCAP to be electrically coupled to a plurality of X-touch pads X-TP. Each of the plurality of Y-touch routing lines Y-TL electrically coupled to the plurality of Y-touch electrode lines Y-TEL can be disposed on the encapsulation portion ENCAP and extended even to a place free of the encapsulation portion ENCAP to be electrically coupled to a plurality of Y-touch pads X-TP. The encapsulation portion ENCAP can be located within the active area AA, and in some cases, can be extended to the non-active area NA.

As described before, the dam area DA can exist in the boundary area between the active area AA and the non-active area or in the non-active area NA outside the active area AA in order to prevent collapse of any layer (e.g., the encapsulation portion in the OLED panel) in the active area AA.

As illustrated in FIG. 8, for example, a primary dam DAM1 and a secondary dam DAM2 can be disposed in the dam area DA. The secondary dam DAM2 can be located more outward than the primary dam DAM1.

Unlike the example of FIG. 8, only the primary dam DAM1 can be located in the dam area DA. In some cases, one or more additional dams as well as the primary dam DAM1 and the secondary dam DAM2 can be disposed in the dam area DA.

Referring to FIG. 8, the encapsulation portion ENCAP can be located on a side surface of the primary dam DAM1, or both side and top surfaces of the primary dam DAM1.

Figure 9:
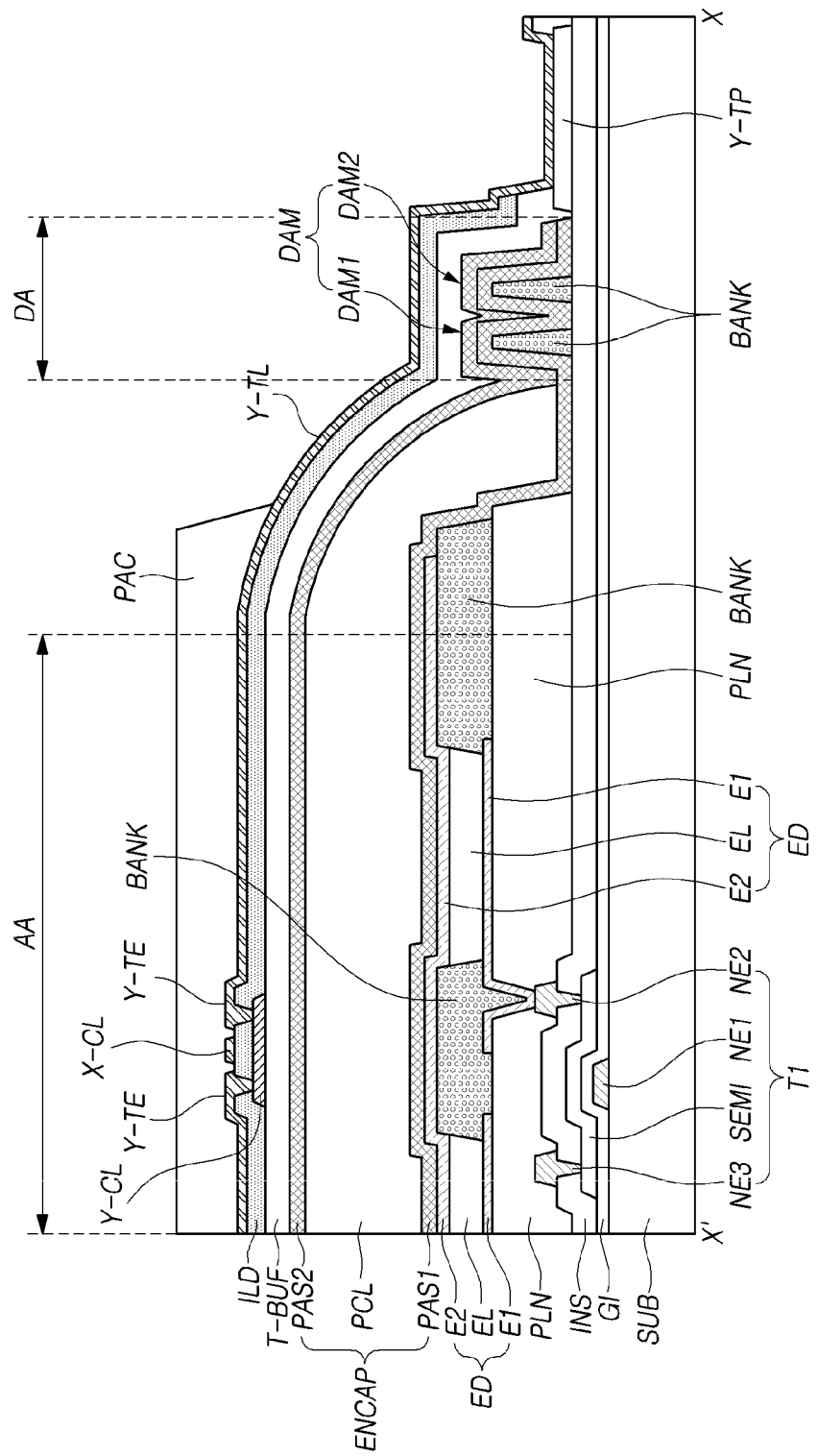
FIG. 9 is a partial sectional view illustrating the display panel, taken along line X-X' illustrated in FIG. 8, according to embodiments of the present disclosure.

FIG. 9 is a partial cross-sectional view of the display panel DISP according to embodiments of the present disclosure, taken along line X-X' illustrated in FIG. 8. While a touch electrode TE is shown as shaped into a plate in FIG. 9, this is merely an example, and the touch electrode TE can be a mesh type. In addition, when the touch electrode TE is a mesh type, an opening OA of the touch electrode TE can be positioned on the light emitting area of a subpixel SP.

The driving transistor, for example, the first transistor T1 of each subpixel SP in the active area AA is disposed on the substrate SUB.

The first transistor T1 includes a first node electrode NE1 corresponding to a gate electrode, a second node electrode NE2 corresponding to a source electrode or a drain electrode, a third node electrode NE3 corresponding to the drain electrode or the source electrode, and a semiconductor layer SEMI.

The first node electrode NE1 and the semiconductor layer SEMI can overlap with each other, with a gate insulation layer GI interposed therebetween. The second node electrode NE2 can be formed on an insulation layer INS to contact one side of the semiconductor layer SEMI, and the third node electrode NE3 can be formed on the insulation layer INS to contact the other side of the semiconductor layer SEMI.

A light emitting element ED can include a first electrode E1 corresponding to an anode electrode (or cathode electrode), a light emitting layer EL formed on the first electrode E1, and a second electrode E2 corresponding to a cathode electrode (or anode electrode) formed on the light emitting layer EL.

The first electrode E1 is electrically coupled to the second node electrode NE2 of the first transistor T1, which is exposed through a pixel contact hole penetrating through a planarization layer PLN.

The light emitting layer EL is formed on the first electrode E1 in a light emitting area defined by banks BANK. The light emitting layer EL is formed by stacking a hole-related layer, a light emitting layer, and an electron-related layer in this order or reverse order on the first electrode E1. The second electrode E2 is formed to oppose the first electrode E1, with the light emitting layer EL interposed therebetween.

The encapsulation portion ENCAP blocks penetration of external moisture or oxygen into the light emitting element ED vulnerable to the external moisture or oxygen.

The encapsulation portion ENCAP can be made up of a single layer or a plurality of layers PAS1, PCL, and PAS2 as illustrated in FIG. 9.

For example, when the encapsulation portion ENCAP is made up of the plurality of layers PAS1, PCL, and PAS2, the encapsulation portion ENCAP can include one or more inorganic encapsulation layers PAS1 and PAS2 and one or more organic encapsulation layers PCL. In a specific example, the encapsulation portion ENCAP can be a sequential stack of the first inorganic encapsulation layer PAS1, the organic encapsulation layer PCL, and the second inorganic encapsulation layer PAS2 in this order.

The organic encapsulation layer PCL can further include at least one organic encapsulation layer or at least one inorganic encapsulation layer.

The first inorganic encapsulation layer PAS1 is formed closest to the light emitting element ED on the substrate SUB on which the second electrode E2 corresponding to the cathode electrode is formed. The first inorganic encapsulation layer PAS1 is formed of, for example, an inorganic insulation material allowing low-temperature deposition such as silicon nitride (SiNx), silicon oxide (SiOx), silicon oxynitride (SiON), or aluminum oxide (Al2O3). Since the first inorganic encapsulation layer PAS1 is deposited in a low-temperature atmosphere, the first inorganic encapsulation layer PAS1 can prevent damage to the light emitting layer EL containing an organic material vulnerable to a high temperature atmosphere in the deposition process.

The organic encapsulation layer PCL can be formed over a smaller area than the first inorganic encapsulation layer PAS1. In this case, the organic encapsulation layer PCL can be formed to expose both ends of the first inorganic encapsulation layer PAS1. The organic encapsulation layer PCL can serve as a buffer for alleviating stress between layers, caused by bending of the touch display device, which is an OLED device, and can serve to enhance planarization performance. The organic encapsulation layer PCL can be formed of, for example, an organic insulation material such as acrylic resin, epoxy resin, polyimide, polyethylene, or silicon oxycarbon (SiOC).

When the organic encapsulation layer PCL is formed in an inkjet scheme, one or more dams DAM can be formed in the dam area DA corresponding to a boundary area between the non-active area NA and the active area AA or a partial area of the non-active area NA.

For example, as illustrated in FIG. 9, the dam area DA can be positioned between the active area AA and a pad area in which the plurality of X-touch pads X-TP and the plurality of Y-touch pads Y-TP are formed in the non-active area NA. The primary dam DAM1 adjacent to the active area AA and the secondary dam DAM2 adjacent to the pad area can exist in the dam area DA.

When the organic encapsulation layer PCL in a liquid form is dropped in the active area AA, the one or more dams DAM disposed in the dam area DA can prevent the organic encapsulation layer PCL in the liquid from collapsing in the direction of the non-active area NA and thus invading the pad area.

The presence of the primary dam DAM1 and the secondary dam DAM2 as illustrated in FIG. 9 can enhance this effect.

The primary dam DAM1 and/or the secondary dam DAM2 can be formed in a single-layer or multi-layer structure. For example, the primary dam DAM1 and/or the secondary dam DAM2 can be simultaneously formed of the same material as at least one of a bank BANK or a spacer. In this case, the dam structure can be formed without an additional mask process and a cost increase.

Further, the primary dam DAM1 and/or the secondary dam DAM2 can be formed in a structure in which the first inorganic encapsulation layer PAST and/or the second inorganic encapsulation layer PAS2 is stacked on the banks BANK, as illustrated in FIG. 9.

Further, the organic encapsulation layer PCL containing an organic material can be located only on the inner side surface of the primary dam DAM1 as illustrated in FIG. 9.

Alternatively, the organic encapsulation layer PCL containing the organic material can be located on at least a part of each of the primary dam DAM1 and the secondary dam DAM2. For example, the organic encapsulation layer PCL can be located on top of the primary dam DAM1.

The second inorganic encapsulation layer PAS2 can be formed on the substrate SUB with the organic encapsulation layer PCL formed thereon, to cover the top surface and a side surface of each of the organic encapsulation layer PCL and the first inorganic encapsulation layer PAS1. The second inorganic encapsulation layer PAS2 minimizes or blocks penetration of external moisture or oxygen into the first inorganic encapsulation layer PAS1 and the organic encapsulation layer PCL. The second inorganic encapsulation layer PAS2 is formed of, for example, an inorganic insulation material such as silicon nitride (SiNx), silicon oxide (SiOx), silicon oxynitride (SiON), or aluminum oxide $(Al_2O_3)$.

A touch buffer film T-BUF can be disposed on the encapsulation portion ENCAP. The touch buffer film T-BUF can be interposed between the touch sensor metal including the X-touch and Y-touch electrodes X-TE and Y-TE and the X-touch and Y-touch electrode connection lines X-CL and Y-CL and the second electrode E2 of the light emitting element ED.

The touch buffer film T-BUF can be designed such that the distance between the touch sensor metal and the second electrode E2 of the light emitting element ED is maintained to be a predetermined minimum value (e.g., 1 μm). Accordingly, parasitic capacitance formed between the touch sensor metal and the second electrode E2 of the light emitting element ED can be reduced or prevented, thereby preventing a decrease in touch sensitivity which might otherwise be caused by the parasitic capacitance.

Without the touch buffer film T-BUF, the touch sensor metal including the X-touch and Y-touch electrodes X-TE and Y-TE and the X-touch and Y-touch electrode connection lines X-CL and Y-CL can be disposed on the encapsulation portion ENCAP.

Further, the touch buffer film T-BUF can block penetration of a chemical solution (e.g., developer or etchant) used in a manufacturing process of the touch sensor metal disposed on the touch buffer film T-BUF or external moisture into the light emitting layer EL containing an organic material. Accordingly, the touch buffer film T-BUF can prevent damage to the light emitting layer EL vulnerable to a chemical solution or moisture.

The touch buffer film T-BUF can be formed at a low temperature equal to or lower than a certain temperature (e.g., 100° C.) to prevent damage to the light emitting layer EL containing an organic material vulnerable to high temperature, and is formed of an organic insulation material having a low dielectric constant of 1 to 3. For example, the touch buffer film T-BUF can be formed of an acrylic-based, epoxy-based, or siloxane-based material. The touch buffer film T-BUF of an organic insulating material, which has planarization performance, can prevent damage to each of the encapsulation layers PAST, PCL, and PAS2 in the encapsulation portion ENCAP and cracks of the touch sensor metal formed on the touch buffer film T-BUF which might otherwise be caused by bending of the OLED device.

According to the mutual-capacitance-based touch sensor structure, the X-touch electrode lines X-TEL and the Y-touch electrode lines Y-TEL can be disposed on the touch buffer film T-BUF, crossing each other.

The Y-touch electrode lines Y-TEL can include a plurality of Y-touch electrodes Y-TE and a plurality of Y-touch electrode connection lines Y-CL that electrically couple between the plurality of Y-touch electrodes Y-TE.

As illustrated in FIG. 9, the plurality of Y-touch electrodes Y-TE and the plurality of Y-touch electrode connection lines Y-CL are disposed on different layers with a touch insulation layer ILD therebetween.

The plurality of Y-touch electrodes Y-TE can be spaced apart from each other at regular intervals along the y-axis direction. Each of the plurality of Y-touch electrodes Y-TE can be electrically coupled to another Y-touch electrode Y-TE adjacent in the y-axis direction through a Y-touch electrode connection line Y-CL.

Each Y-touch electrode connection line Y-CL can be formed on the touch buffer film T-BUF and exposed through touch contact holes penetrating through the touch insulation film ILD, and can be electrically coupled to two adjacent Y touch electrodes Y-TE in the y-axis direction.

The Y-touch electrode connection line Y-CL can be disposed to overlap with a bank BANK. Accordingly, it is possible to prevent the Y-touch electrode connection line Y-CL from decreasing an aperture ratio.

The X-touch electrode lines X-TEL can include a plurality of X-touch electrodes X-TE and a plurality of X-touch electrode connection lines X-CL that electrically couple between the plurality of X-touch electrodes X-TE. The plurality of X-touch electrodes X-TE and the plurality of X-touch electrode connection lines X-CL are disposed on different layers with the touch insulation layer ILD therebetween.

The plurality of X-touch electrodes X-TE can be spaced apart from each other at regular intervals along the x-axis direction on the touch insulation film ILD. Each of the plurality of X-touch electrodes X-TE can be electrically coupled to another X-touch electrode X-TE adjacent in the x-axis direction through a X-touch electrode connection line X-CL.

Each X-touch electrode connection line X-CL can be disposed on the same plane as the X-touch electrodes X-TE and electrically coupled to or integrated with two adjacent X touch electrodes X-TE in the x-axis direction, without contact holes.

The X-touch electrode connection line X-CL can be disposed to overlap with a bank BANK. Accordingly, it is possible to prevent the X-touch electrode connection line X-CL from decreasing an aperture ratio.

The Y-touch electrode lines Y-TEL can be electrically coupled to the touch driving circuit TDC through the Y-touch routing lines Y-TL and the Y-touch pads Y-TP. Similarly, the X-touch electrode lines X-TEL can be electrically coupled to the touch driving circuit TDC through the X-touch routing lines X-TL and the X-touch pads X-TP.

A pad cover electrode can be further disposed to cover the X-touch pads X-TP and the Y-touch pads Y-TP.

The X-touch pads X-TP can be formed separately from the X-touch routing lines X-TL, or can be extended from the X-touch routing lines X-TL. The Y-touch pads Y-TP can be formed separately from the Y-touch routing lines Y-TL, or can be extended from the Y-touch routing lines Y-TL.

When the X-touch pads X-TP are extended from the X-touch routing lines X-TL, and the Y-touch pads Y-TP are extended from the Y-touch routing lines Y-TL, the X-touch pads X-TP, the X-touch routing lines X-TL, the Y-touch pads Y-TP, and the Y-touch routing lines Y-TL can be formed of the same first conductive material. The first conductive material can be a metal having good corrosion resistance, acid resistance, and conductivity, such as Al, Ti, Cu, and Mo, which can be formed into a single layer or multiple layers.

For example, the X-touch pads X-TP, the X-touch routing lines X-TL, the Y-touch pads Y-TP, and the Y-touch routing lines Y-TL can be formed of the first conductive material in a 3-layer stack such as Ti/Al/Ti or Mo/Al/Mo.

The pad cover electrode that can cover the X-touch pads X-TP and the Y-touch pads Y-TP can be formed of the same second conductive material as the X-touch and Y-touch electrodes X-TE and Y-TE. The second conductive material can be a transparent conductive material such as ITO or IZO having strong corrosion resistance and acid resistance. The pad cover electrode can be formed to be exposed by the touch buffer film T-BUF to be bonded to the touch driving circuit TDC or a circuit film on which the touch driving circuit TDC is mounted.

The touch buffer film T-BUF can be formed to cover the touch sensor metal, thereby preventing the touch sensor metal from being corroded by external moisture or the like. For example, the touch buffer film T-BUF can be formed of an organic insulation material, or can be a circular polarization plate or an epoxy or acrylic film. The touch buffer film T-BUF may not exist on the encapsulation portion ENCAP. For example, the touch buffer film T-BUF may not be an essential component.

The Y-touch routing lines Y-TL can be electrically coupled to the Y-touch electrodes Y-TE through touch routing line contact holes or integrated with the Y-touch electrodes Y-TE.

The Y-touch routing lines Y-TL can be extended to the non-active area NA, pass the top and side surfaces of the encapsulation portion ENCAP and the top and side surfaces of the dam DAM, and be electrically coupled to the Y-touch pads Y-TP. Accordingly, the Y-touch routing lines Y-TL can be electrically coupled to the touch driving circuit TDC through the Y-touch pads Y-TP.

The Y-touch routing lines Y-TL can transfer the touch sensing signal from the Y-touch electrodes Y-TE to the touch driving circuit TDC or the touch driving signal from the touch driving circuit TDC to the Y-touch electrodes Y-TE.

The X-touch routing lines X-TL can be electrically coupled to the X-touch electrodes X-TE through touch routing line contact holes or integrated with the X-touch electrodes X-TE.

The X-touch routing lines X-TL can be extended to the non-active area NA, pass the top and side surfaces of the encapsulation portion ENCAP and the top and side surfaces of the dam DAM, and be electrically coupled to the X-touch pads X-TP. Accordingly, the X-touch routing lines X-TL can be electrically coupled to the touch driving circuit TDC through the X-touch pads X-TP.

The X-touch routing lines X-TL can transfer the touch driving signal received from the touch driving circuit TDC to the X-touch electrodes X-TE, and the touch sensing signal received from the X-touch electrodes X-TE to the touch driving circuit TDC.

The arrangement of the X-touch routing lines X-TL and the Y-touch routing lines Y-TL can be changed in various manners according to a panel design.

A touch protection film PAC can be disposed on the X-touch electrodes X-TE and the Y-touch electrodes Y-TE. The touch protection film PAC can be extended to before or after the dam DAM and thus disposed on the X-touch routing lines X-TL and the Y-touch routing lines Y-TL.

The cross-sectional view of FIG. 9 conceptually illustrates the structure. The position, thickness, or width of each pattern (each layer or electrode) can vary according to a viewing direction or location, the connection structures of various patterns can also be changed, and a layer can be added to, omitted from, or integrated with the illustrated layers. For example, the width of a bank BANK can be narrower than shown in the drawing, and the height of the dam DAM can be lower or higher than shown in the drawing. Further, the cross-sectional view of FIG. 9 illustrates the structure in which a touch electrode TE and a touch routing line TL are disposed on the entirety of a subpixel SP, in order to show an exemplary structure connected to a touch pad TP along the inclined surfaces of the touch routing wire TL and the encapsulation portion ENCAP. However, when the touch electrode TE is the afore-mentioned mesh type, an opening OA of the touch electrode TE can be positioned on the light emitting area of the subpixel SP. Further, a color filter CF can be further disposed on the encapsulation portion ENCAP. The color filter CF can be positioned on the touch electrodes TE, or between the encapsulation portion ENCAP and the touch electrodes TE.

Figure 10:
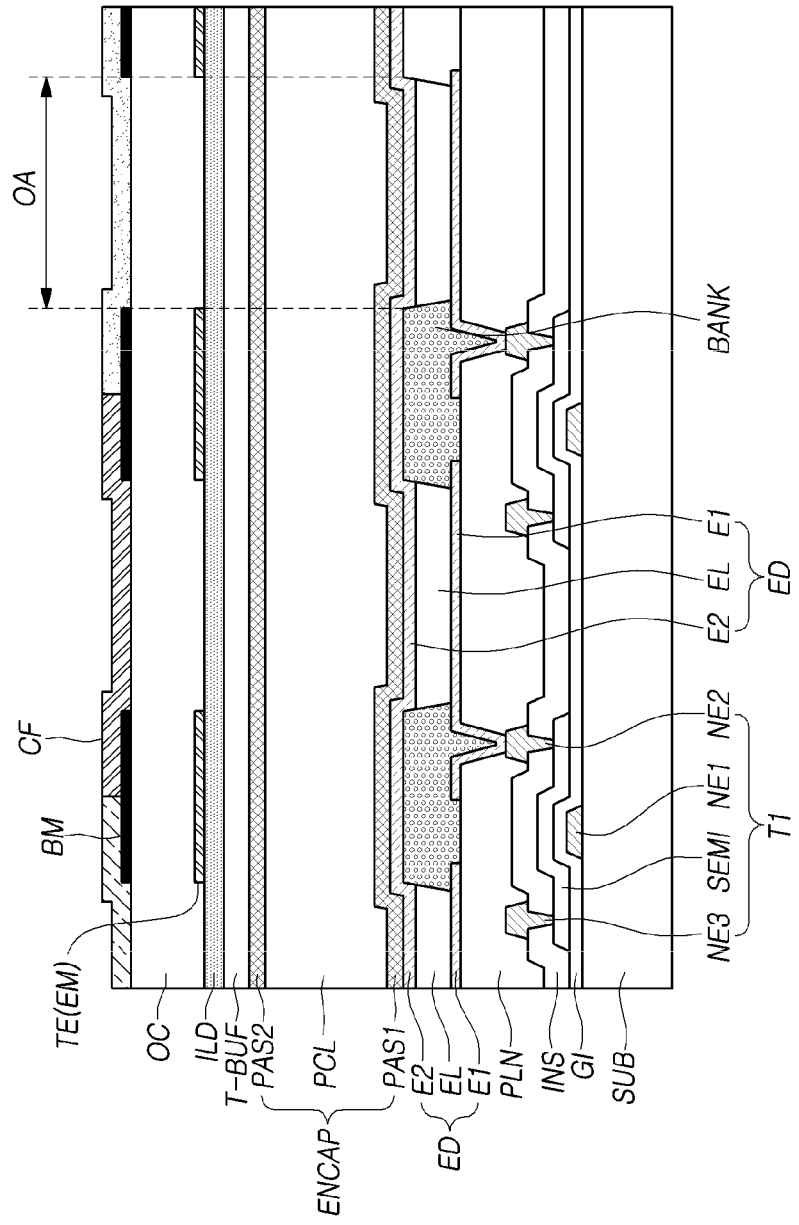
FIGS. 10 and 11 are diagrams illustrating exemplary cross-section structures of the display panel, when the display panel includes a color filter, according to embodiments of the present disclosure.
Figure 11:
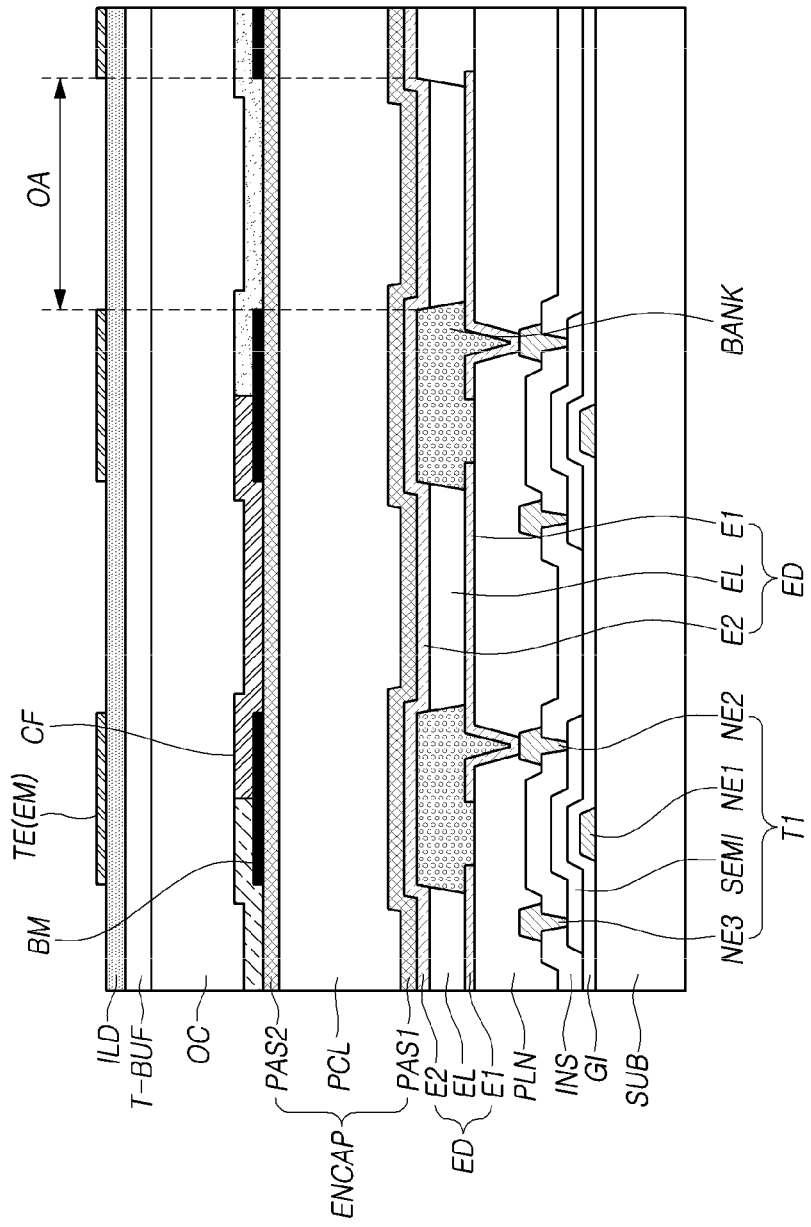

FIGS. 10 and 11 are diagrams illustrating exemplary cross-sectional structures of the display panel DISP, when the display panel DISP includes the color filter CF according to embodiments of the present disclosure.

Referring to FIGS. 10 and 11, when the touch panel TSP is built in the display panel DISP, and the display panel DISP is implemented as an OLED panel, the touch panel TSP can be positioned on the encapsulation portion ENCAP in the display panel DISP. In other words, the touch sensor metal including the plurality of touch electrodes TE and the plurality of touch routing lines TL can be positioned on the encapsulation portion ENCAP in the display panel DISP.

As described before, as the touch electrodes TE are formed on the encapsulation portion ENCAP, the touch electrodes TE can be formed without significantly affecting display performance and display-related layer formation.

Referring to FIGS. 10 and 11, the second electrode E2, which can be a cathode electrode of an OLED, can be positioned under the encapsulation portion ENCAP.

The thickness T of the encapsulation portion ENCAP can be, for example, 1 micrometer or more.

As described before, parasitic capacitance generated between the second electrode E2 of the OLED and a touch electrode TE can be reduced by setting the thickness of the encapsulation portion ENCAP to 1 micrometer or more. Accordingly, it is possible to prevent a decrease in touch sensitivity, caused by parasitic capacitance.

As described above, in each of the plurality of touch electrodes TE, the electrode metal EM is patterned into a mesh with two or more openings OA, and each of the two or more openings OA can correspond to one or more subpixels or the light emitting areas of the one or more subpixels, when viewed from the vertical direction.

As described above, the electrode metal EM of the touch electrode TE can be patterned such that when viewed from a plane, the light emitting areas of one or more subpixels exist in correspondence with the position of each of two or more openings OA present in the area of the touch electrode TE. Therefore, the light emitting efficiency of the display panel DISP can be increased.

As illustrated in FIGS. 10 and 11, black matrices BM can be disposed on the display panel DISP, and color filters CF can be further disposed on the display panel DISP.

The positions of the black matrices BM can correspond to those of the electrode metals EM of the touch electrodes TE.

The positions of a plurality of color filters CF correspond to the positions of a plurality of touch electrodes TE or the electrode metals EM of the plurality of touch electrodes TE.

As described above, since the plurality of color filters CF are located at positions corresponding to the positions of a plurality of openings OA, the light emission performance of the display panel DISP can be improved.

The vertical positional relationship between the plurality of color filters CF and the plurality of touch electrodes TE is described below.

As illustrated in FIG. 10, the plurality of color filters CF and the black matrices BM can be positioned on the plurality of touch electrodes TE.

In this case, the plurality of color filters CF and the black matrices BM can be positioned on an overcoat layer OC disposed on the plurality of touch electrodes TE. The overcoat layer OC can be identical to or different from the touch protection layer PAC illustrated in FIG. 9.

Alternatively, as illustrated in FIG. 11, the plurality of color filters CF and the black matrices BM can be positioned under the plurality of touch electrodes TE.

In this case, the plurality of touch electrodes TE can be located on the overcoat layer OC disposed on the color filters CF and the black matrices BM. The overcoat layer OC can be identical to or different from the touch buffer film T-BUF or the touch insulation film ILD illustrated in FIG. 9.

Alternatively, the touch buffer film T-BUF or the touch insulation film ILD can be disposed separately from the overcoat layer OC.

The touch display device according to embodiments of the present disclosure can include an area fixed in a bent state (a bending area) or an area which is foldable and unfoldable (a folding area) depending on its type.

The bending area or the folding area can be located in the non-active area NA or active area AA of the display panel DISP. Accordingly, when the bending area or the folding area is defined in the active area AA, touch electrodes TE can be located in a curved area.

Figure 12:
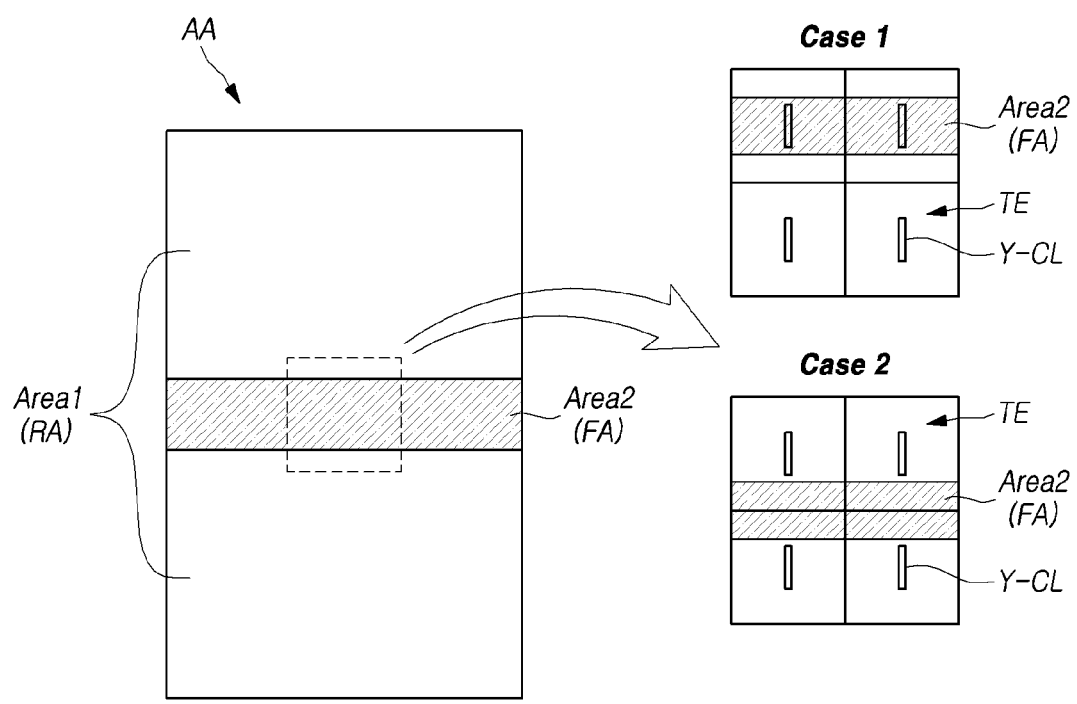
FIG. 12 is a diagram illustrating an exemplary structure of the touch display device including a folding area according to embodiments of the present disclosure.

FIG. 12 is a diagram illustrating an exemplary structure in which the touch display device incudes a folding area FA according to embodiments of the present disclosure.

Referring to FIG. 12, the active area AA of the display panel DISP can include a reference area RA fixed in its shape and a folding area FA deformable to be folded or unfolded according to a user's manipulation. In the present disclosure, the reference area RA can be referred to as a first area Area1, and the folding area FA can be referred to as a second area Area2, for the convenience of description.

The active area AA can include a plurality of reference areas RA and at least one folding area FA defined between the reference areas RA. For example, the active area AA can include two reference areas RA and one folding area FA defined between the reference areas RA, as illustrated in FIG. 12. Alternatively, the active area AA can include three or more reference areas RA and two or more folding areas FA each being defined between two reference areas RA, when needed.

As the folding area FA in which the display panel DISP is foldable or unfoldable is defined in the active area AA, touch electrodes TE for touch sensing can be located in the folding area FA of the active area AA.

For example, the folding area FA can be defined in an area in which touch electrode connection lines CL each connecting adjacent touch electrodes TE are arranged in a different layer from that of the touch electrodes TE in Case 1 illustrated FIG. 12. When the above-described example is taken, the folding area FA can be defined in an area including an area in which Y-touch electrode connection lines Y-CL are arranged. Further, when the X-touch electrode connection lines X-CL are arranged in a different layer from that of the touch electrodes TE, the folding area FA can overlap with an area in which X-touch electrode connection lines X-CL are arranged.

In another example, the folding area FA can be defined in an area without any Y-touch electrode connection line Y-CL in Case 2 illustrated in FIG. 12. For example, the folding area FA can be interposed between Y-touch electrode connection lines Y-CL. In this case, only touch electrodes TE can be arranged in the folding area FA. In the present disclosure, the following description is made with the appreciation that each of the touch electrode connection lines CL disposed in the folding area FA refers to a line which is disposed in a different layer from that of the touch electrodes TE and connects adjacent touch electrodes TE.

Alternatively, the folding area FA can overlap with a part of an area in which touch electrode connection lines CL are arranged, when needed. Further, while the folding area FA is shown in the example of FIG. 12 as defined in a direction crossing the direction in which the touch electrodes TE are connected to each other by the touch electrode connection lines CL, the folding area FA can be defined in the same direction in which the touch electrodes TE are connected to each other by the touch electrode connection lines CL, when needed.

For example, when the folding area FA is defined in the active area AA, the folding area FA may or may not overlap with an area in which touch electrode connection lines CL are arranged, when needed. The folding area FA can be formed in the direction crossing the arrangement direction of the touch electrode connection lines CL or in the same direction as the arrangement direction of the touch electrode connection lines CL.

In embodiments of the present disclosure, when the folding area FA is defined in the active area AA, the use of a pattern structure of a touch insulation film ILD disposed between the touch electrodes TE and the touch electrode connection lines CL in the folding area FA can prevent generation of cracks on the touch electrodes TE in the folding area FA.

Figure 13:
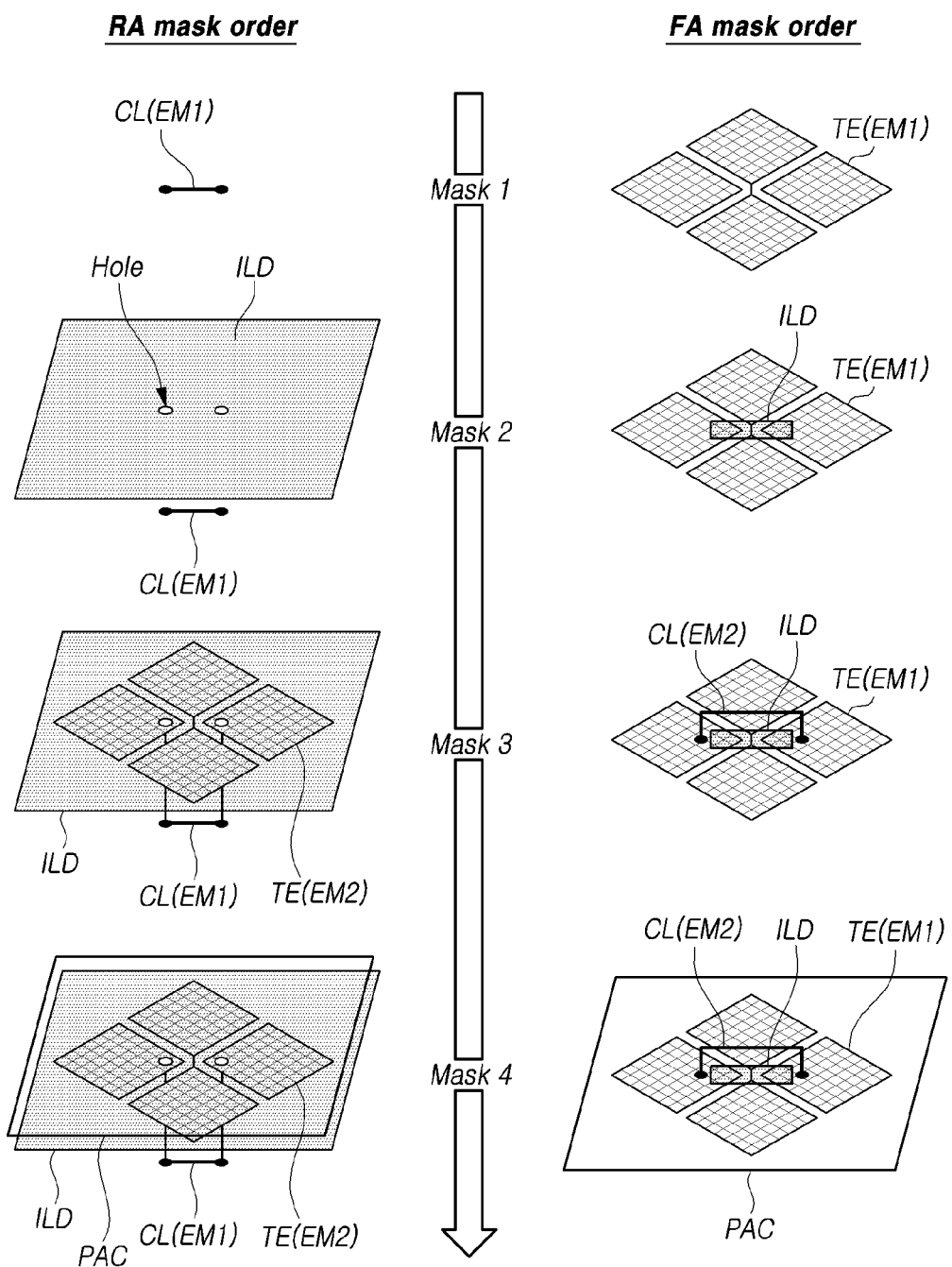
FIG. 13 is a diagram illustrating an exemplary process of forming a reference area and a folding area in Case 1 illustrated in FIG. 12.

FIG. 13 is a diagram illustrating an exemplary process of forming a reference area RA and a folding area FA in Case 1 illustrated in FIG. 12.

Referring to FIG. 13, a touch electrode connection line CL can be disposed on an encapsulation portion ENCAP in the reference area RA (Mask 1). A touch insulation film ILD can be disposed on the touch electrode connection line CL (Mask 2). The touch electrode connection line CL can be formed of a first electrode metal EM1.

Touch electrodes TE can be disposed on the touch insulation film ILD (Mask 3). The touch electrodes TE can be formed of a second electrode metal EM2 and coupled to the touch electrode connection line CL through holes formed into the touch insulation film ILD. A touch protection film PAC can be disposed on the touch electrodes TE (Mask 4).

When the folding area FA is defined in an area in which touch electrode connection lines CL are disposed, touch electrodes TE can first be disposed in the folding area FA (Mask 1). The touch electrodes TE disposed in the folding area FA can be formed of the first electrode metal EM1. For example, the touch electrodes TE disposed in the folding area FA can be formed of the same material as the touch electrode connection line CL disposed in the reference area RA.

A touch insulation film ILD can be disposed on the touch electrodes TE in the folding area FA (Mask 2).

The touch insulation film ILD disposed on the touch electrodes TE in the folding area FA can be limited only to an area in which touch electrode connection lines CL intersect each other. For example, the touch insulation film ILD can be disposed only in an area in which an X-touch electrode connection line X-CL in the same layer as the touch electrodes TE intersects a Y-touch electrode connection line Y-CL in a different layer from the touch electrodes TE. For example, the touch insulation film ILD can be disposed in the form of an island in the folding area FA.

A touch electrode connection line CL can be disposed on the touch insulation film ILD to couple adjacent two touch electrodes TE to each other (Mask 3). The touch electrode connection line CL can be formed of the second electrode metal EM2. For example, the touch electrode connection line CL disposed in the folding area FA can be formed of the same material as the touch electrodes TE disposed in the reference area RA.

The touch protection film PAC can be disposed on the touch electrode connection line CL (Mask 4).

Because the touch insulation film ILD is disposed only in an area in which the touch electrode connection lines CL intersect each other in the folding area FA, force applied to the touch electrodes TE in the folding area FA can be reduced during folding or unfolding of the folding area FA. For example, the pattern structure of the touch insulation film ILD can prevent cracks on the touch electrodes TE caused by folding of the folding area FA as well as a short circuit between touch electrode connection lines CL coupling different touch electrodes TE to each other.

Further, the touch electrode connection lines CL arranged in the reference area RA can be located in the same layer as the touch electrode connection lines CL disposed in the folding area FA, when needed.

For example, the touch electrodes TE can first be disposed and then the touch insulation film can be disposed on the touch electrodes TE in the reference area RA and the folding area FA. Then, the touch electrode connection lines CL can be disposed on the touch insulation film ILD.

The touch insulation film ILD can be disposed over the whole reference area RA, whereas the touch insulation film ILD can be patterned and disposed only in areas in which the touch electrode connection lines CL intersect each other in the folding area RA.

This pattern structure of the touch insulation film ILD in the folding area FA can prevent cracks on the touch electrodes TE disposed in the folding area FA. Further, as the touch electrodes are disposed in the same layer in both the reference area RA and the folding area FA, damage to the touch electrodes TE can be prevented, which might otherwise be caused by a step structure between touch electrodes TE or a connection part between the touch electrodes TE at the boundary between the reference area RA and the folding area FA.

Figure 14:
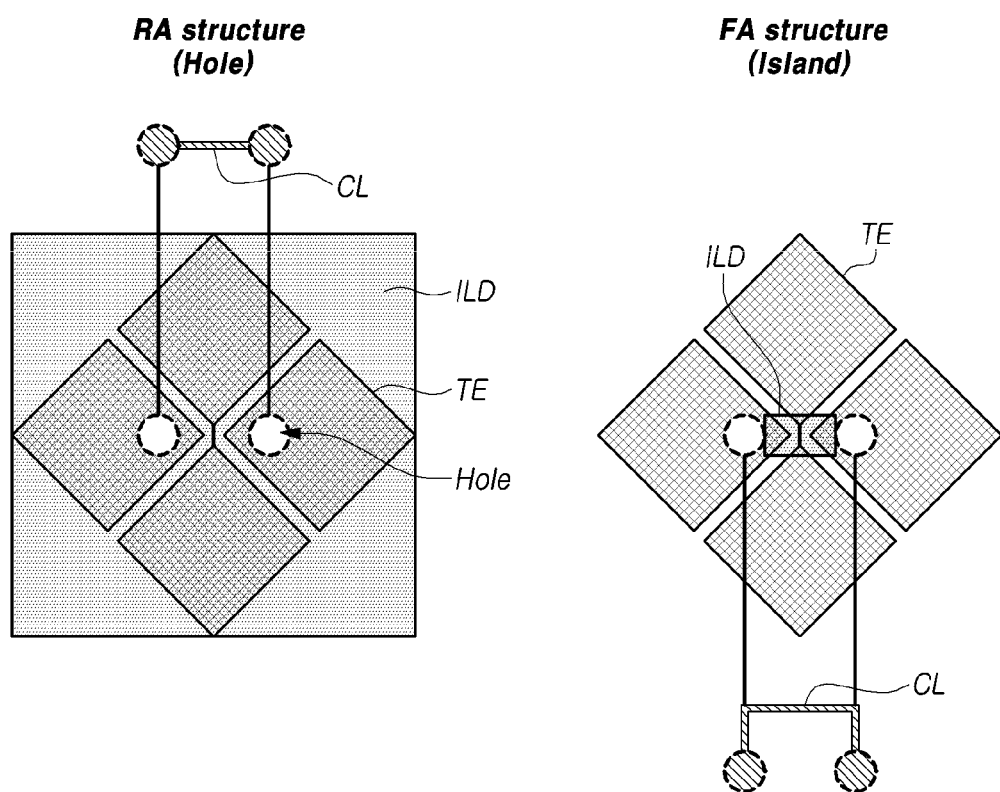
FIG. 14 is a diagram illustrating exemplary connection structures between touch electrodes and a touch electrode connection line in the reference area and the folding area in Case 1 illustrated in FIG. 12.

FIG. 14 is a diagram illustrating exemplary connection structures between touch electrodes and a touch electrode connection line in the reference area RA and the folding area FA in Case 1 illustrated in FIG. 12.

Referring to FIG. 14, the touch insulation film ILD can be disposed over the whole reference area RA. Touch electrodes TE disposed in the reference area RA can be coupled to a touch electrode connection line CL through holes formed into the touch insulation film ILD.

In the folding area FA, the touch insulation film ILD can be disposed in an area in which a touch electrode connection line CL coupling touch electrodes TE adjacent in one direction to each other intersects a touch electrode connection line CL coupling touch electrodes TE adjacent in another direction to each other.

For example, the touch insulation film ILD can be disposed only in an area requiring prevention of a short circuit between touch electrode connection lines CL. Since the touch insulation film ILD is disposed only in partial areas of the folding area FA, force from folding can be reduced, thereby preventing folding-incurred cracks on the touch electrodes TE disposed in the folding area FA.

Further, as the pattern structure of the touch insulation film ILD prevents cracks on the touch electrodes TE in the folding area FA, the pattern structure of the touch electrodes TE in the folding area FA can be maintained to be identical to the pattern structure of the touch electrodes TE in the reference area RA. Accordingly, touch sensing performance can be maintained uniform, while damage to the touch electrodes TE in the folding area FA is prevented.

The touch electrodes TE and the touch electrode connection lines CL can be stacked in the reference area RA and the folding area FA in the same order or different orders, as described above.

The touch electrodes TE can be coupled to the touch electrode lines CL through holes formed into the touch insulation film ILD in the folding area FA, as in the reference area RA. Alternatively, since the touch insulation film ILD is disposed in the form of islands in the folding area FA, the touch electrodes TE can be coupled to the touch electrode connection liens CL without the need for forming holes into the touch insulation film ILD in the folding area FA.

Figure 15A:
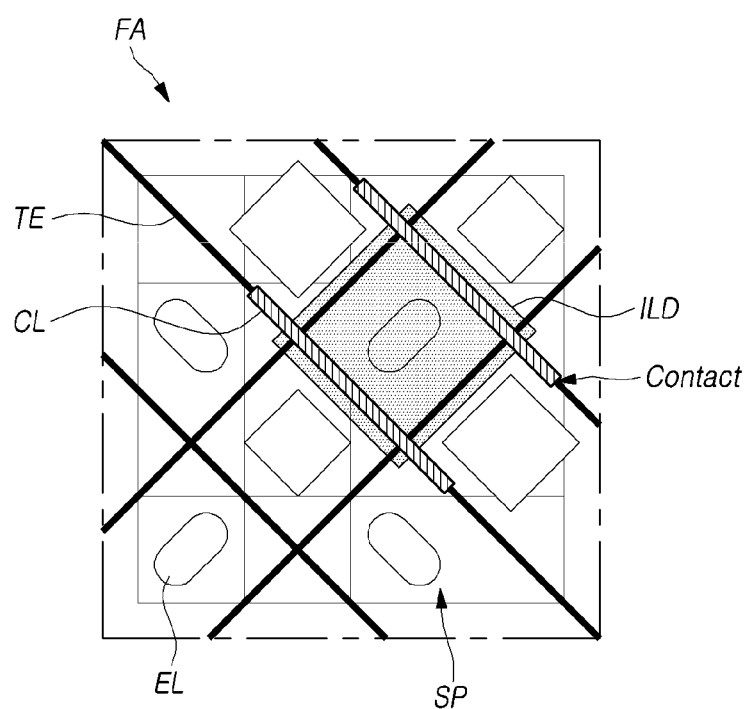
FIGS. 15A, 15B and 15C are diagrams illustrating exemplary arrangement structures of a touch insulation film in the folding area in Case 1 illustrated in FIG. 12.
Figure 15B:
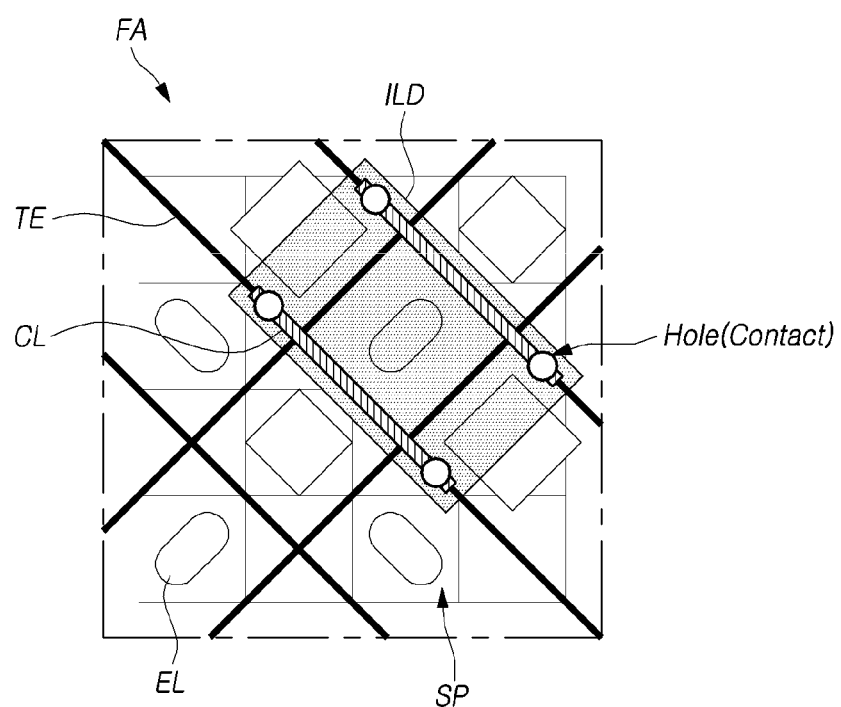
Figure 15C:
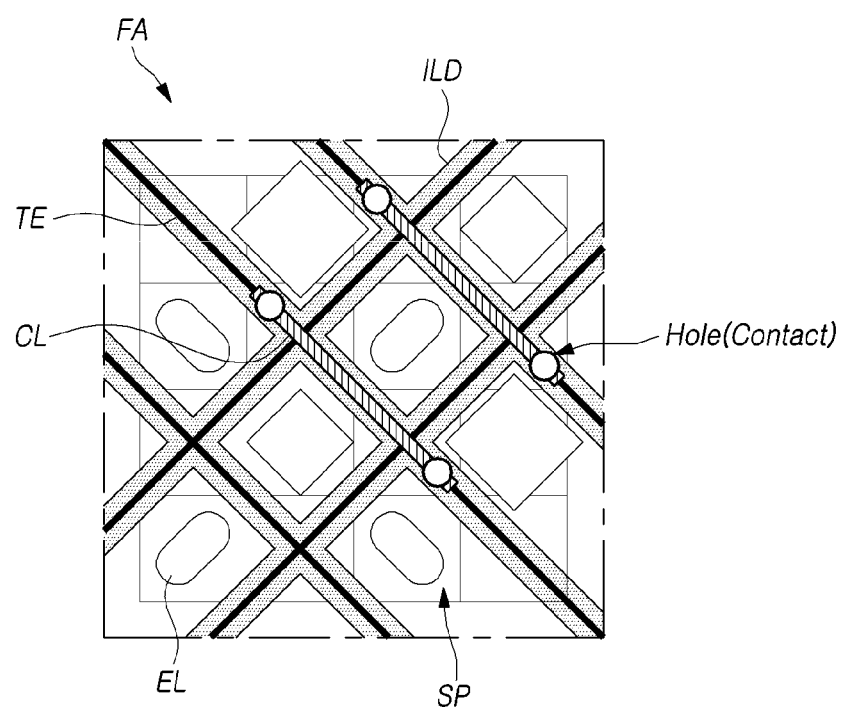

FIGS. 15A, 15B and 15C are diagrams illustrating exemplary arrangement structures of the touch insulation film ILD in the folding area FA in Case 1 illustrated in FIG. 12.

Referring to FIG. 15A, mesh-type touch electrodes TE can be disposed on the encapsulation portion ENCAP in the folding area FA. Openings OA of the touch electrodes TE can be positioned in correspondence with the light emitting areas of subpixels SP.

The touch insulation film ILD can be disposed in the form of islands on the touch electrodes TE, and a touch electrode connection line CL can be disposed on the touch insulation film ILD. The touch electrode connection line CL can be disposed along the top and side surfaces of the touch insulation film ILD and couple adjacent touch electrodes TE to each other.

For example, the touch electrode connection line CL overlapping with the touch insulation film ILD can be coupled to the touch electrodes TE along the outer surfaces of the touch insulation film ILD, without holes formed into the touch insulation film ILD.

Therefore, the pattern structure of the touch insulation film ILD for preventing cracks on the touch electrodes TE in the folding area FA can be formed, while areas occupied by the touch insulation film ILD are minimized and the process of forming holes into the touch insulation film ILD is reduced.

Alternatively, the touch insulation film ILD can include holes in the folding area FA, like the touch insulation film ILD disposed in the reference area RA.

Referring to FIG. 15B, mesh-type touch electrodes TE can be disposed on the encapsulation portion ENCAP in the folding area FA. A touch electrode connection line CL can be disposed on the touch insulation film ILD.

The touch insulation film ILD can include holes, and the touch electrode connection line CL can be coupled to the touch electrodes TE through the holes formed in the touch insulation film ILD.

Accordingly, as the touch electrode connection line CL is disposed on the touch insulation film ILD without being bent along the outer surfaces of the touch insulation film ILD, the touch electrode connection line CL can be stronger in structure.

Further, when needed, the touch insulation film ILD can additionally be disposed in an area other than an area in which touch electrode connection lines CL coupling different touch electrodes intersect each other, in the folding area FA.

As illustrated in FIG. 15C, for example, the touch insulation film ILD can be disposed on touch electrodes TE, and a touch electrode connection line CL can be disposed on the touch insulation film ILD.

The touch insulation film ILD can be disposed along the shapes of the touch electrodes TE in areas in which the touch electrodes TE are disposed.

In an area in which the touch electrode connection line CL is disposed, the touch insulation film ILD can be disposed in the form of an island as in the foregoing example, or overlapping with the touch electrodes TE as in the example of FIG. 15C.

The touch insulation film ILD overlapping with the touch electrode connection line CL can be connected to or separate from the touch insulation film ILD disposed in an area without the touch electrode connection line CL.

As the touch insulation film ILD is disposed on the touch electrodes TE along the shapes of the touch electrodes TE as described above, force from folding can be applied not to the touch electrodes TE but to the touch insulation film ILD in the folding area FA. Accordingly, cracks on the touch electrodes TE in the folding area FA can be prevented.

Further, when the touch electrodes connection lines CL located in a different layer from the touch electrodes TE are not disposed in the folding area FA, the touch insulation film ILD can be disposed on touch electrodes TE along the shapes of the touch electrodes TE as in the foregoing example.

Alternatively, the touch insulation film ILD can be disposed under the touch electrodes TE in the folding area FA, partially removed in the areas in which the touch electrodes TE are disposed or in areas without the touch electrodes TE.

Figure 16A:
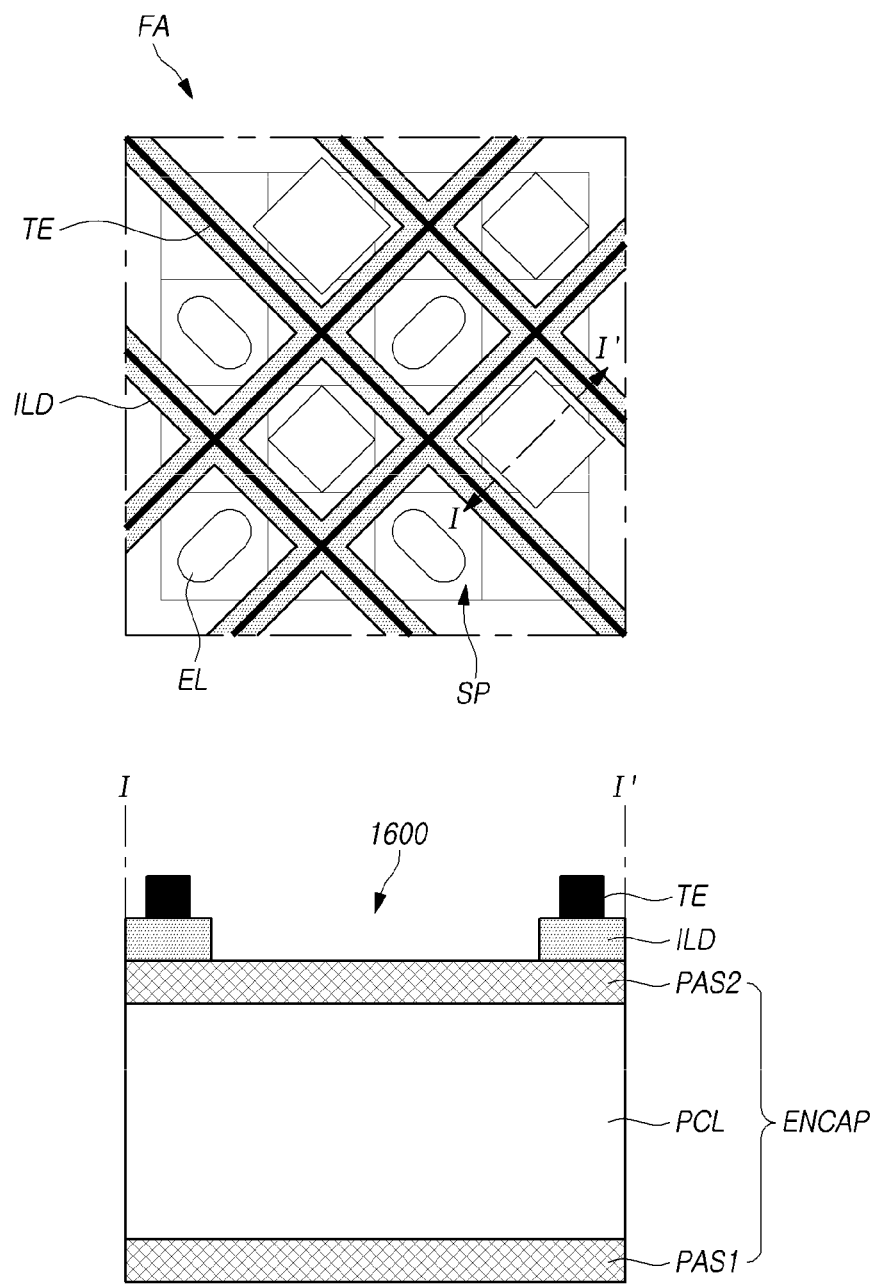
FIGS. 16A and 16B are diagrams illustrating exemplary arrangement structures of a touch electrode and a touch insulation film in the folding area in Case 2 illustrated in FIG. 12.
Figure 16B:
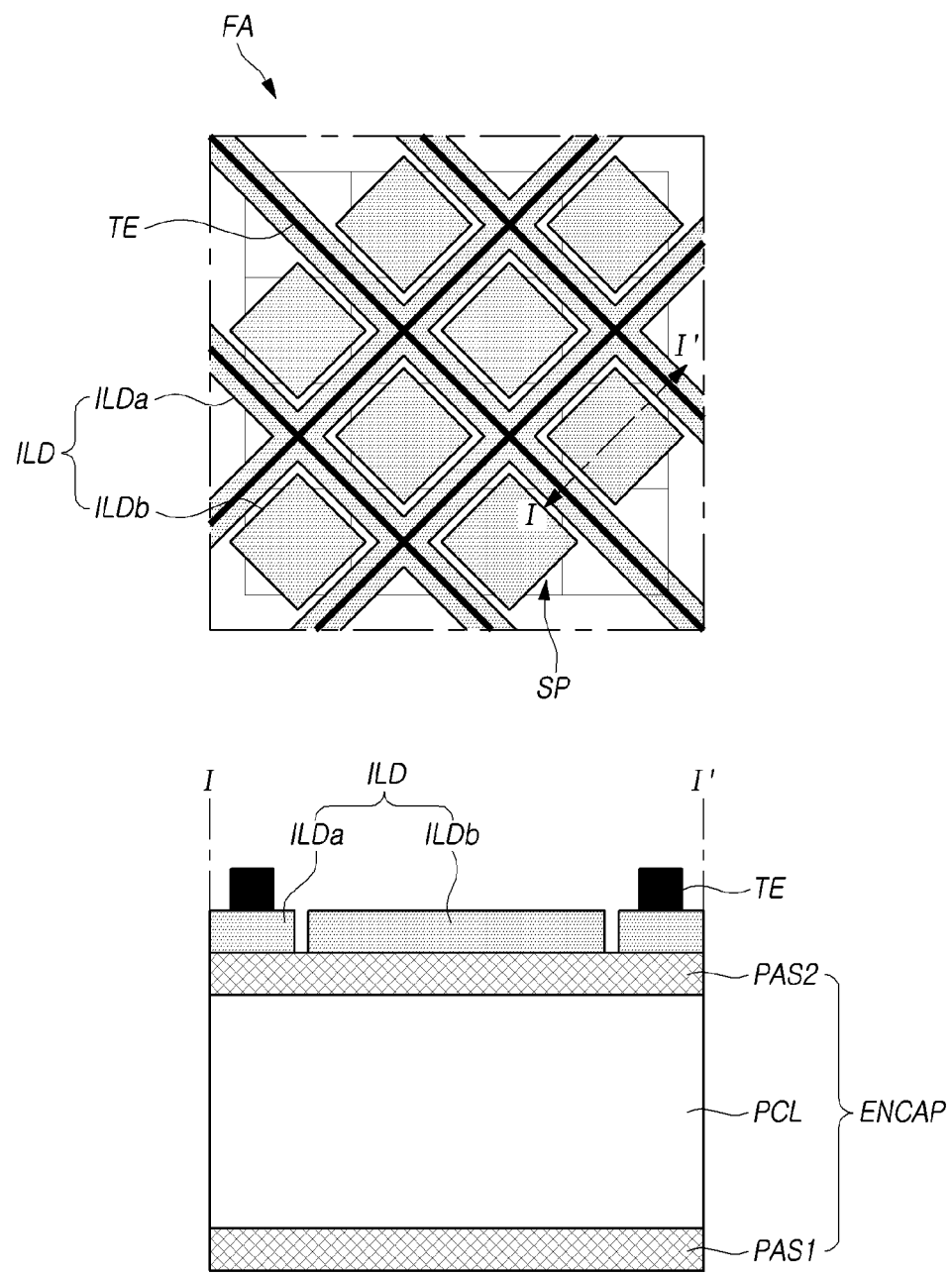

FIGS. 16A and 16B are diagrams illustrating exemplary arrangement structures of touch electrodes TE and a touch insulation film ILD in the folding area FA in Case 2 illustrating FIG. 12. More specifically, FIGS. 16A and 16B illustrate exemplary structures of the touch electrodes TE and the touch insulation film ILD arranged in the folding area FA, when none of the touch electrode connection lines CL located in a different layer from the touch electrodes TE are disposed in the folding area FA.

Referring to FIG. 16A, the touch insulation film ILD can be disposed to overlap with the touch electrodes TE in the folding area FA. The width of the touch insulation film ILD can be equal to or larger than the width of the touch electrodes TE.

For example, the touch insulation film ILD can be disposed on the touch electrode connection lines CL on the encapsulation portion ENCAP, and the touch electrodes TE can be disposed on the touch insulation film ILD. In the reference area RA, the touch buffer film T-BUFF, the touch electrode connection lines CL, the touch insulation film ID, and the touch electrodes TE can be sequentially disposed on the encapsulation portion ENCAP. In the folding area FA, the touch buffer film T-BUF, the touch insulation film ILD, and the touch electrodes TE can be sequentially disposed.

In the folding area FA, the touch insulation film ILD can be disposed only in areas overlapping with the touch electrodes TE.

For example, the touch insulation film ILD can be removed in areas 1600 in the folding area FA.

As such, the touch insulation film-free areas can correspond to the openings OA of the mesh-type touch electrodes TE. Accordingly, the touch insulation film-free areas can correspond to the light emitting areas of subpixels SP in the folding area FA.

Because the touch insulation film ILD is disposed under the touch electrodes TE along the shapes of the touch electrodes TE in the folding area FA, force from folding of the folding area FA can be applied to the touch insulation film ILD, thereby preventing cracks on the touch electrodes TE.

Further, since the touch insulation film ILD is removed in the areas corresponding to the light emitting areas of subpixels SP, the pattern structure of the touch insulation film ILD designed to prevent cracks on the touch electrodes TE can also increase the light emission efficiency of the subpixels SP.

For example, the pattern structure of the touch insulation film ILD in the folding area FA can improve both touch performance and display performance.

Alternatively, to increase the performance of preventing cracks on the touch electrodes TE in the folding area FA, the touch insulation film ILD can be disposed separately for the openings OA of the touch electrodes TE, when needed. In this case, the decrease of a transmittance can be minimized by controlling the thickness of the touch insulation film ILD.

For example, as illustrated in FIG. 16B, the touch insulation film ILD and the touch electrodes TE can be disposed on the encapsulation portion ENCAP in the folding area FA.

The touch insulation film ILD disposed in the folding area FA can include a first part ILDa overlapping with the touch electrodes TE and second parts ILDb corresponding to the openings OA of the touch electrodes TE. The first part ILDa can be separated from the second parts ILDb in the touch insulation film ILD.

Therefore, when the folding area FA is folded, force can be concentrated at the boundaries between the separate areas of the touch insulation film ILD disposed under the touch electrodes TE, For example, between the first part ILDa and second parts ILDb of the touch insulation film ILD, thereby further preventing damage to the touch electrodes TE, which might otherwise be caused by the folding of the folding area FA.

As described above, cracks on the touch electrodes TE in the folding area FA can be prevented by disposing the touch insulation film ILD only in areas overlapping with the touch electrodes TE or disposing the touch insulation film ILD separately in the areas overlapping with the touch electrodes TE and the areas overlapping with the openings of the touch electrodes TE. Therefore, cracks on the touch electrodes TE in the folding area FA can be prevented.

Alternatively, the touch insulation film ILD can be removed in the areas in which the touch electrodes TE are disposed, not in the openings OA of the touch electrodes TE, to reduce cracks on the touch electrodes TE.

Figure 17A:
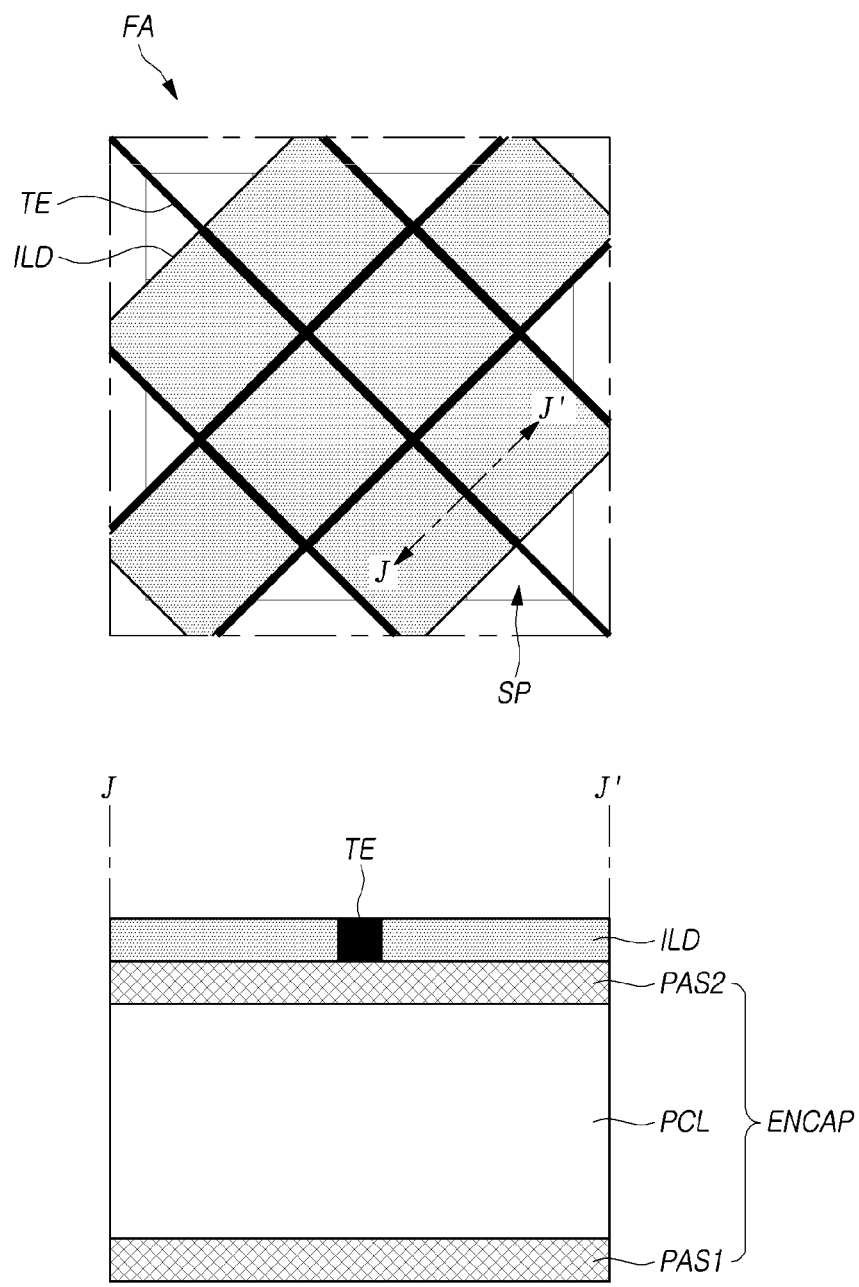
FIGS. 17A, 17B and 17C are diagrams illustrating other exemplary arrangements of a touch electrode and a touch insulation film in the folding area in Case 2 illustrated in FIG. 12.
Figure 17B:
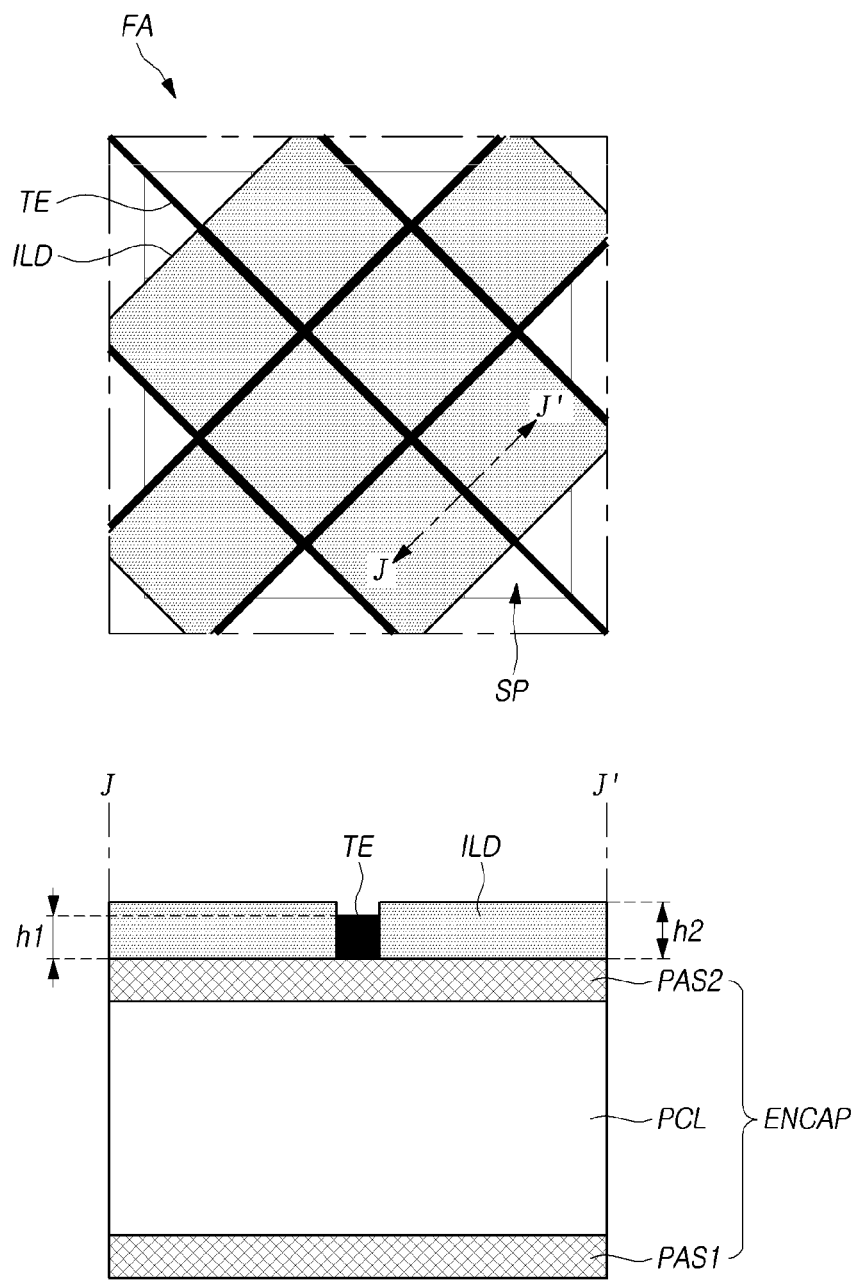
Figure 17C:
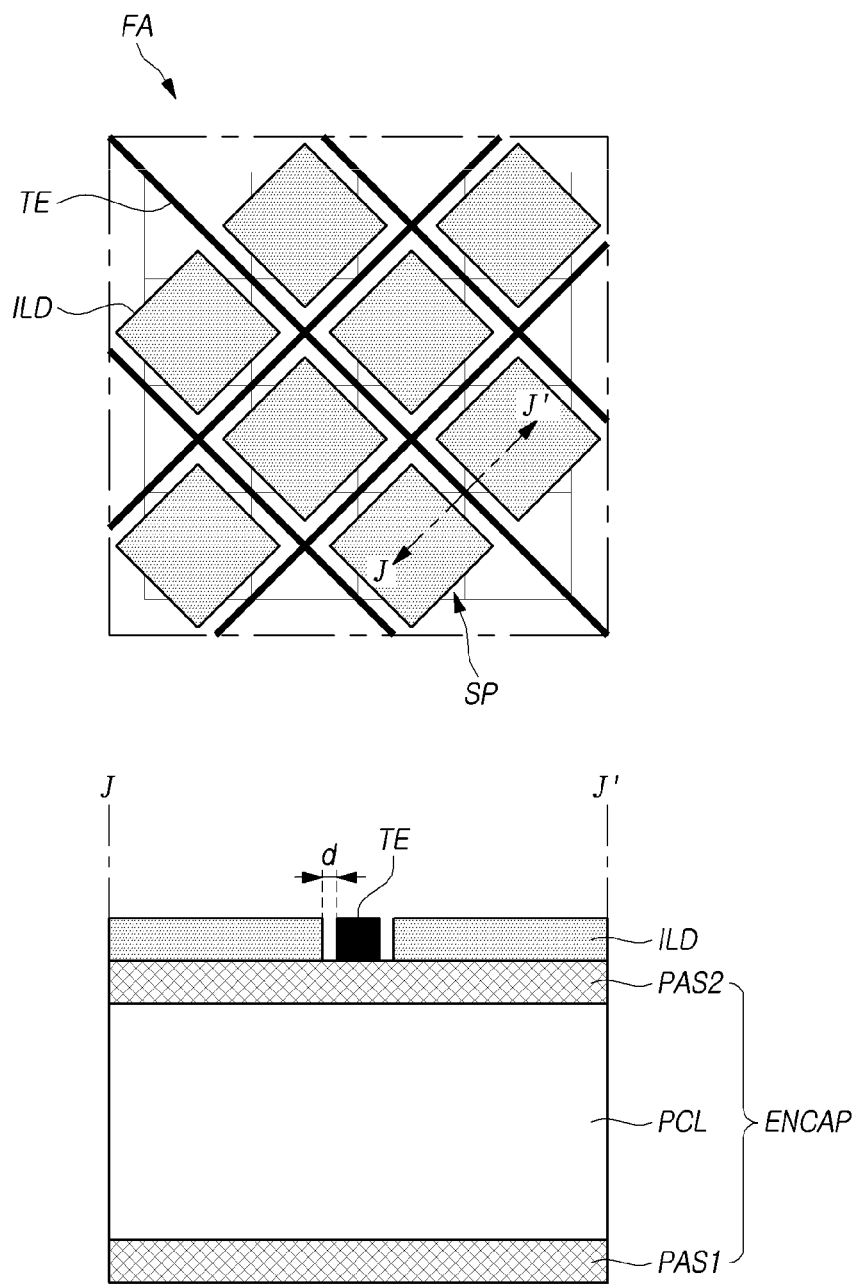

FIGS. 17A, 17B and 17C are diagrams illustrating other exemplary arrangement structures of the touch electrodes TE and the touch insulation film ILD in the folding area FA in Case 2 illustrated in FIG. 12.

Referring to FIG. 17A, the touch electrodes TE and the touch insulation film ILD can be disposed on the encapsulation portion ENCAP in the folding area FA.

The touch insulation film ILD can be disposed, with parts thereof overlapping with the touch electrodes TE removed in the folding area FA.

For example, as illustrated in the example of FIG. 17A, the touch electrodes TE can be disposed in the areas from which the touch insulation film ILD has been removed in the folding area FA. The side surfaces of the touch electrodes TE can contact the side surfaces of the touch insulation film ILD.

In this structure with no touch electrode connection line CL in the folding area FA, the touch electrodes TE can be disposed in the areas from which the touch insulation film ILD has been removed. Therefore, the touch insulation film ILD supports the side surfaces of the touch electrodes TE, thereby preventing cracks on the touch electrodes TE disposed in the folding area FA.

The touch electrodes TE disposed in the reference area RA can be located in the same layer as or a different layer from the touch electrodes TE disposed in the folding area FA.

The above structure in which the touch insulation film ILD is removed from the arrangement areas of the touch electrodes TE in the folding area FA can prevent cracks on the touch electrodes TE in the folding area FA, which might otherwise be caused by folding of the folding area FA.

The thickness of the touch insulation film ILD positioned in the areas without the touch electrodes TE and the distance between the touch insulation film ILD and each of the touch electrodes TE can be controlled.

For example, as illustrated in the example of FIG. 17B, the touch insulation film ILD can be removed from the areas in which the touch electrodes TE are arranged in the folding area FA. Further, the thickness h1 of the touch insulation film ILD can be larger than the thickness h1 of the touch electrodes TE disposed in the folding area FA.

For example, the touch insulation film ILD can enhance the function of supporting the touch electrodes TE by the structure in which the touch electrodes TE are positioned low inside the areas from which the touch insulation film ILD has been removed in the folding area FA.

Therefore, the touch electrodes TE in the folding area FA can be more robust against folding-incurred cracks.

In another example, as illustrated in FIG. 17C, the touch insulation film ILD can be removed from the areas in which the touch electrodes TE are arranged and from parts of the openings OA of the touch electrodes TE. For example, the touch insulation film ILD can be positioned inside the openings OA of the touch electrodes TE, spaced apart from each of the touch electrodes TE by a predetermined gap d.

As the touch insulation film ILD positioned in the openings OA of the touch electrodes TE are spaced apart from the touch electrodes TE, force from folding of the folding area FA can be applied to the touch insulation film ILD, thereby preventing cracks on the touch electrodes TE.

For example, the structures illustrated in FIGS. 17A and 17B can prevent cracks on the touch electrodes TE by protecting the touch electrodes TE by the touch insulation film ILD disposed in a predetermined pattern structure even though the touch electrodes TE receive force from folding of the folding area FA.

In contrast, the structure illustrated in FIG. 17C can prevent cracks on the touch electrodes TE by distributing force from folding of the folding area FA to the touch insulation film ILD.

While the examples of FIGS. 17A, 17B and 17C are for a case in which none of the touch electrode connection lines CL located in a different layer from the touch electrodes TE are disposed in the folding area FA, the examples can also be applied when touch electrode connection liens CL are disposed in the folding area FA.

In this case, the touch electrodes TE can be disposed in the areas from which the touch insulation film ILD has been removed. The touch insulation film ILD can be additionally disposed in areas in which touch electrode connection lines CL overlap with the touch electrodes TE.

For example, the afore-described island structure of the touch insulation film ILD in the folding area FA can also be applied to the examples illustrated in FIGS. 17A, 17B and 17C, when needed.

According to the above-described embodiments of the present disclosure, when a folding area FA is defined in the active area AA of the display panel DISP, a touch insulation film ILD can be disposed only in an area in which a short circuit between touch electrode connection lines CL is to be prevented in the folding area FA. The resulting reduction of force from folding of the folding area FA can prevent cracks on touch electrodes TE.

Alternatively, the touch insulation film can be removed from an area without any touch electrode TE or from an area with a touch electrode TE in the folding area FA. Therefore, the touch electrodes TE can be protected against force from folding of the folding area FA, thereby reducing cracks on the touch electrodes TE.

For example, the embodiments of the present disclosure can provide a structure which maintains the same pattern of touch electrodes TE in both the reference area RA and the folding area FA and which is robust against cracks in the folding area FA, by applying a pattern structure of the touch insulation film ILD positioned in a layer between the touch electrodes TE and the touch electrode connection lines CL to prevent cracks on the touch electrodes TE in the folding area FA.

Therefore, damage to the touch electrodes TE in the folding area FA can be prevented (or minimized), and touch sensing sensitivity can be uniform in the reference area RA and the folding area FA, thereby improving touch sensing performance of the touch display device including the folding area FA defined in the active area AA.

The above description has been presented to enable any person skilled in the art to make and use the technical ideas of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. The above description and the accompanying drawings provide an example of the technical idea of the present invention for illustrative purposes only. For example, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A touch display device comprising:
    an active area in which a plurality of subpixels each including a light emitting element are disposed, the active area including a plurality of first areas and at least one folding area between the plurality of first areas;
    an encapsulation layer disposed on one of the light emitting elements;
    a plurality of touch electrodes located on the encapsulation layer and disposed in the active area;
    a plurality of first touch electrode connection lines disposed in a layer in which the plurality of touch electrodes are disposed on the encapsulation layer, each of the plurality of first touch electrode connection lines coupling two touch electrodes adjacent in a first direction to each other;
    a plurality of second touch electrode connection lines disposed in a layer different from the layer in which the plurality of touch electrodes are disposed on the encapsulation layer, each of the plurality of second touch electrode connection lines coupling two touch electrodes adjacent in a second direction to each other; and
    a touch insulation film disposed in the plurality of first areas and at least a part of the at least one folding area, and disposed in a layer between the layer in which the plurality of touch electrodes are disposed and the layer in which the plurality of second touch electrode connection lines are disposed, wherein the touch insulation film has a pattern structure in the at least one folding area.

2. The touch display device according to claim 1, wherein the touch insulation film is disposed on the plurality of touch electrodes and under the plurality of second touch electrode connection lines, and wherein the touch insulation film is disposed in each of areas in which the plurality of first touch electrode connection lines intersect the plurality of second touch electrode connection lines, in the at least one folding area.

3. The touch display device according to claim 2, wherein the plurality of second touch electrode connection lines are coupled to the plurality of touch electrodes through holes included in the touch insulation film, in the at least one folding area.

4. The touch display device according to claim 2, wherein the plurality of second touch electrode connection lines are disposed on parts of a top surface and side surfaces of the touch insulation film and coupled to the plurality of touch electrodes, in the at least one folding area.

5. The touch display device according to claim 2, wherein the touch insulation film is further disposed in an area overlapping with the plurality of touch electrodes in the at least one folding area.

6. The touch display device according to claim 2, wherein the touch insulation film is disposed over an entire area of the plurality of first areas, and the plurality of second touch electrode connection lines disposed in the plurality of first areas are coupled to the plurality of touch electrodes through holes included in the touch insulation film.

7. The touch display device according to claim 1, wherein the touch insulation film is disposed on the plurality of second touch electrode connection lines and under the plurality of touch electrodes, and wherein the touch insulation film is disposed in an area overlapping with the plurality of touch electrodes in the at least one folding area.

8. The touch display device according to claim 7, wherein the touch insulation film includes at least one opening located in an area overlapping with an opening of the plurality of touch electrodes in the at least one folding area.

9. The touch display device according to claim 8, wherein the opening of the touch insulation film is located in correspondence with a light emitting area of a subpixel, in the at least one folding area.

10. The touch display device according to claim 7, wherein the touch insulation film includes a first part disposed in the area overlapping with the plurality of touch electrodes, and a second part disposed in an area overlapping with an opening of the plurality of touch electrodes and separated from the first part, in the at least one folding area.

11. The touch display device according to claim 7, wherein the at least one folding area is located in an area except for an area in which the plurality of second touch electrode connection lines are disposed, in the active area.

12. The touch display device according to claim 1, wherein the plurality of first areas are fixed and the at least one folding area is foldable.

13. A touch display device comprising:

an active area including a plurality of first areas and at least one folding area between the plurality of first areas;

a plurality of touch electrodes disposed in the active area;

a plurality of first touch electrode connection lines disposed in a layer in which the plurality of touch electrodes are disposed, each of the plurality of first touch electrode connection lines coupling two of the plurality of touch electrodes adjacent in a first direction to each other;

a plurality of second touch electrode connection lines disposed in a different layer from the layer in which the plurality of touch electrodes are disposed, each of the plurality of second touch electrode connection lines coupling two of the plurality of touch electrodes adjacent in a second direction to each other; and a touch insulation film disposed in the plurality of first areas and at least a part of the at least one folding area, wherein the touch insulation film has a pattern structure in the at least one folding area.

14. The touch display device according to claim 13, wherein a side surface of the touch insulation film disposed in an area other than an area overlapping with the plurality of touch electrodes contacts the plurality of touch electrodes, in the at least one folding area.

15. The touch display device according to claim 13, wherein a side surface of the touch insulation film disposed in an area other than an area overlapping with the plurality of touch electrodes is spaced apart from the plurality of touch electrodes, in the at least one folding area.

16. The touch display device according to claim 13, wherein a thickness of the touch insulation film disposed in an area other than an area overlapping with the plurality of touch electrodes is equal to or larger than a thickness of the plurality of touch electrodes, in the at least one folding area.

17. The touch display device according to claim 13, wherein the touch insulation film disposed in an area overlapping with the plurality of second touch electrode connection lines includes a plurality of holes, and the plurality of second touch electrode connection lines are coupled to the plurality of touch electrodes through the holes included in the touch insulation film, in the at least one folding area.

18. The touch display device according to claim 13, wherein the plurality of second touch electrode connection lines are disposed on parts of a top surface and side surfaces of the touch insulation film disposed in an area overlapping with the plurality of second touch electrode connection lines and coupled to the plurality of touch electrodes, in the at least one folding area.

19. A touch display device comprising:

an active area including a plurality of first areas and at least one folding area between plurality of the first areas;

a plurality of touch electrodes disposed in the active area; and a touch insulation film disposed in the plurality of first areas and at least a part of the at least one folding area, wherein the touch insulation film has a pattern structure in the at least one folding area.

20. The touch display device according to claim 19, wherein the touch insulation film includes a first part disposed in an area overlapping with the plurality of touch electrodes, and a second part disposed in an area except for the area overlapping with the plurality of touch electrodes and separated from the first part, in the at least one folding area.

* * * * *